United States Patent
Kim et al.

(10) Patent No.: US 10,698,764 B2
(45) Date of Patent: Jun. 30, 2020

(54) ERROR CORRECTION METHODS AND SEMICONDUCTOR DEVICES USING THE SAME

(71) Applicant: SK hynix Inc., Gyeonggi-do (KR)

(72) Inventors: Chang Hyun Kim, Seoul (KR); Yong Mi Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 85 days.

(21) Appl. No.: 16/110,313

(22) Filed: Aug. 23, 2018

(65) Prior Publication Data
US 2019/0188075 A1 Jun. 20, 2019

(30) Foreign Application Priority Data
Dec. 15, 2017 (KR) .................. 10-2017-0173258

(51) Int. Cl.
| G06F 11/10 | (2006.01) |
| G11C 29/52 | (2006.01) |
| G11C 7/10 | (2006.01) |
| G11C 29/04 | (2006.01) |

(52) U.S. Cl.
CPC ...... *G06F 11/1068* (2013.01); *G06F 11/1048* (2013.01); *G11C 7/1006* (2013.01); *G11C 7/1051* (2013.01); *G11C 7/1069* (2013.01); *G11C 7/1096* (2013.01); *G11C 29/52* (2013.01); *G11C 2029/0411* (2013.01)

(58) Field of Classification Search
CPC ............ G06F 11/1068; G06F 11/1048; G11C 7/1006; G11C 7/1069; G11C 7/1096; G11C 7/1051; G11C 29/52; G11C 2029/0411
See application file for complete search history.

(56) References Cited

U.S. PATENT DOCUMENTS

| 4,736,376 A * | 4/1988 | Stiffler | H03M 13/19 714/703 |
| 7,028,248 B2 * | 4/2006 | Chen | H03M 13/15 714/785 |
| 2002/0152444 A1 * | 10/2002 | Chen | H03M 13/15 714/785 |
| 2012/0221917 A1 * | 8/2012 | Bueb | G06F 11/1012 714/755 |
| 2019/0035485 A1 * | 1/2019 | Tate | G11C 29/42 |

* cited by examiner

*Primary Examiner* — Thien Nguyen
(74) *Attorney, Agent, or Firm* — IP & T Group LLP

(57) ABSTRACT

A semiconductor device includes a read data generation circuit and a syndrome generation circuit. The read data generation circuit generates first read data from first output data and a first output parity which are generated during a first read operation. In addition, the read data generation circuit generates second read data from second output data and a second output parity which are generated during a second read operation. The syndrome generation circuit generates a syndrome signal from the first read data and the second read data. The syndrome generation circuit generates the syndrome signal so that column vectors of a first half matrix corresponding to the first read data are symmetric to column vectors of a second half matrix corresponding to the second read data.

30 Claims, 21 Drawing Sheets

ERROR CORRECTION METHODS AND SEMICONDUCTOR DEVICES USING THE SAME

CROSS-REFERENCE TO RELATED APPLICATIONS

This application claims priority under 35 U.S.C. 119(a) to Korean Patent Application No. 10-2017-0173258, filed on Dec. 15, 2017, which is incorporated herein by reference in its entirety.

BACKGROUND

1. Technical Field

Embodiments of the present disclosure relate generally to a semiconductor device capable of correcting or recovering data errors.

2. Related Art

A semiconductor may be designed according to various schemes to input or output multi-bit data during every clock cycle for improving an operation speed of the semiconductor device.

However, as the speed for inputting or outputting data to and from the semiconductor device increases, the probability for a data error may also increase. Thus, improved methods and/or devices may be required for enhancing data processing to and from a memory device.

In data processing in semiconductor devices, in order to improve the reliability of data transmission, data are typically transmitted with error codes which are used for detecting and correcting errors in the data. Hence, typical error codes may include an error detection code (EDC) for detecting errors and an error correction code (ECC) for correcting the errors.

SUMMARY

According to an embodiment, a semiconductor device can include a read data generation circuit and a syndrome generation circuit. The read data generation circuit generates first read data from first output data and a first output parity generated during a first read operation. In addition, the read data generation circuit generates second read data from second output data and a second output parity generated during a second read operation. The syndrome generation circuit generates a syndrome signal based at least on the first read data and the second read data.

According to another embodiment, there is provided a method of correcting errors of data. The method includes a first step, a second step and a third step. The first step is performed to generate first read data from first output data and a first output parity which are provided during a first read operation. The second step is performed to generate a first pre-syndrome group including error information on the first read data and to store the first pre-syndrome group. The third step is performed to generate second read data from second output data and a second output parity which are provided during a second read operation, to generate a second pre-syndrome group including error information on the second read data, and to generate a syndrome signal by performing a logical operation of the first pre-syndrome group and the second pre-syndrome group.

According to another embodiment, a semiconductor device includes a memory area and a syndrome generation circuit. The memory area stores input data and a parity during a write operation. The memory area outputs first input data of the input data as first output data and outputs the parity as an output parity, during a first read operation. The memory area outputs second input data of the input data as second output data and outputs the parity as the output parity, during a second read operation. The syndrome generation circuit generates the parity from the input data during the write operation. The syndrome generation circuit generates the parity by performing a logical operation of the first output data and the output parity during the first read operation. The syndrome generation circuit generates a syndrome signal by performing a logical operation of the parity generated during the first read operation, the second output data and the output parity, during the second read operation. The syndrome generation circuit generates the syndrome signal so that column vectors of a first half matrix corresponding to the first output data are symmetric to column vectors of a second half matrix corresponding to the second output data.

Other applications of the disclosure will become apparent to those skilled in the art from the following description of preferred embodiments contemplated for practicing the invention in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

The present disclosure provides a semiconductor device capable of symmetrically adjusting or controlling a column vector of a matrix, which is used for performing a read operation twice during a read operation to generate a syndrome for data error correction, and reducing a size of a circuit establishing a matrix.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
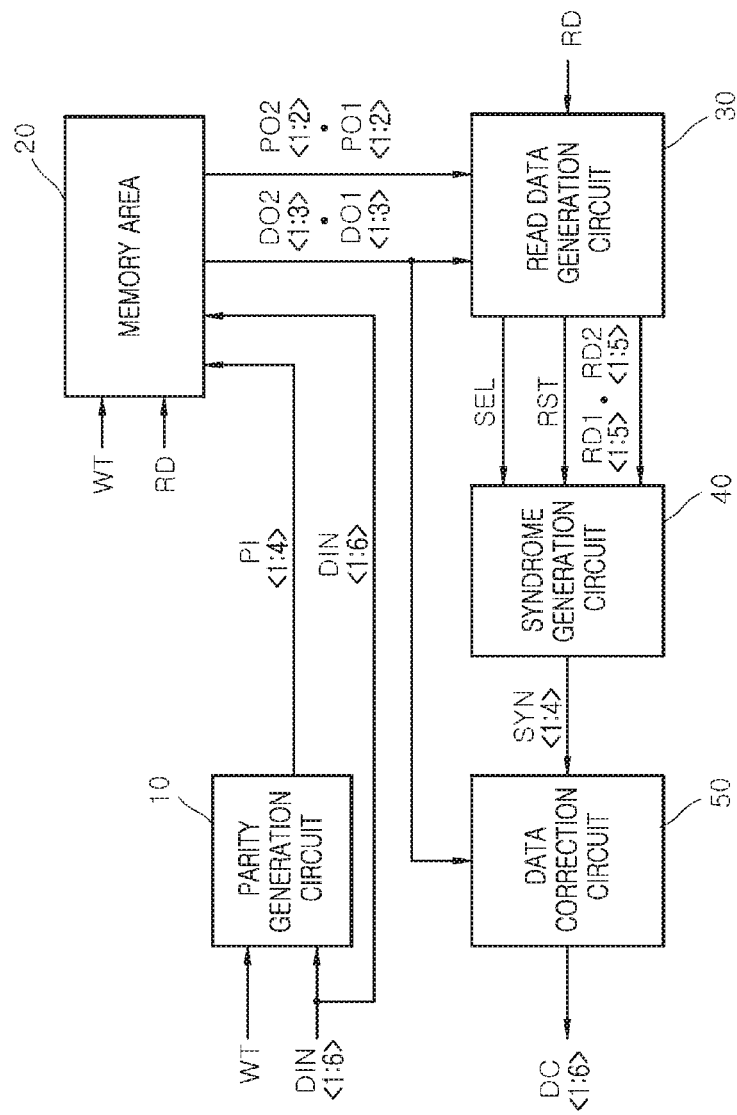
FIG. 1 is a block diagram illustrating a configuration of a semiconductor device according to an example of the present disclosure.

Referring now to FIG. 1, an exemplary configuration of a semiconductor device is provided. The semiconductor device includes a parity generation circuit 10, a memory area 20, a read data generation circuit 30, a syndrome generation circuit 40 and a data correction circuit 50.

In a write operation, the parity generation circuit 10 may generate a parity PI<1:4> including error information about an input data DIN<1:6>. The parity generation circuit 10 may generate the parity PI<1:4> including the error information about the input data DIN<1:6> in response to a write signal WT Inputted to the parity generation circuit 10 during the write operation. The parity generation circuit 10 may perform a logical operation on data bits included in the input data DIN<1:6> to generate the parity PI<1:4> during the write operation. For example, the parity generation circuit 10 may use a Hamming code to generate the parity PI<1:4>. The Hamming code may be implemented in a matrix for correcting errors of data, e.g., the input data DIN<1:6>. In an embodiment, the parity generation circuit 10 may include an error correction code (ECC) circuit (not shown) using a Hamming code to generate the parity PI<1:4>.

The memory area 20 may store the input data DIN<1:6> and the parity PI<1:4> during the write operation. In the memory area 20, the input data DIN<1:6> and the parity PI<1:4> may be stored in response to the write signal WT inputted to the memory area 20 during the write operation. The memory area 20 may store some, e.g., the input data DIN<1:3>, of the input data DIN<1:6> into a first memory area of the memory area 20 in response to the write signal WT. The memory area 20 may store other data, e.g., the input data DIN<4:6>, of the input data DIN<1:6> into a second memory area of the memory area 20 in response to the write signal WT. The first memory area and the second memory area may be two different memory spaces in the memory area 20. The first memory area and the second memory area may be two separate memory spaces in the memory area 20. The first and second memory areas may be set as memory spaces where the input data DIN<1:6> are stored. The memory area 20 may store some of the parity, e.g., the parity PI<1:2>, of the parity PI<1:4> into a third memory area of the memory area 20 in response to the write signal WT. The memory area 20 may store the remaining of the parity e.g., the parity PI<3:4>, of the parity PI<1:4> into a fourth memory area of the memory area 20 in response to the write signal WT. The third memory area and the fourth memory area may be established as two different memory spaces in the memory area 20. The third and fourth memory areas may be set as memory spaces where the parity PI<1:4> is stored.

In a read operation, the memory area 20 may output the input data DIN<1:3> stored in the first memory area as a first output data DO1<1:3> during a first read operation. The memory area 20 may output the input data DIN<1:3> stored in the first memory area as the first output data DO1<1:3> in response to a read signal RD. The memory area 20 may output the parity PI<1:2> stored in the third memory area as a first output parity PO1<1:2> during the first read operation. The memory area 20 may output the parity PI<1:2> stored in the third memory area as the first output parity PO1<1:2> In response to the read signal RD. The memory area 20 may output the input data DIN<4:6> stored in the second memory area as second output data DO2<1:3> during a 15 second read operation. The memory area 20 may output the input data DIN<4:6> stored in the second memory area as the second output data DO2<1:3> in response to the read signal RD. The memory area 20 may output the parity PI<3:4> stored in the fourth memory area as a second output parity PO2<1:2> during the second read operation. The memory area 20 may output the parity PI<3:4> stored in the fourth memory area as the second output parity PO2<1:2> in response to the read signal RD.

The read data generation circuit 30 may generate first read data RD1<1:5> based at least on the first output data DO1<1:3> and the first output parity PO1<1:2> outputted from the memory area 20 during the first read operation. The read data generation circuit 30 may combine the first output data DO1<1:3> with the first output parity PO1<1:2> to generate (or synthesize) the first read data RD1<1:5>. The read data generation circuit 30 may generate second read data RD2<1:5> based at least on the second output data DO2<1:3> and the second output parity PO2<1:2> outputted from the memory area 20 during the second read operation. The read data generation circuit 30 may output the second read data RD2<1:5> by combining the second output data DO2<1:3> and the second output parity PO2<1:2> outputted from the memory area 20 during the second read operation. The read data generation circuit 30 may generate a selection signal SEL which can be enabled during a predetermined period in response to the read signal RD. The read data generation circuit 30 may generate a reset signal RST which can be enabled during a predetermined period in response to the read signal RD and the selection signal SEL.

The syndrome generation circuit 40 may generate a syndrome signal SYN<1:4> based at least on the first read data RD1<1:5> and the second read data RD2<1:5>. The syndrome signal SYN<1:4> can be obtained from matrices implemented from the first read data RD1<1:5> and the second read data RD2<1:5> (illustrated in FIG. 9). The syndrome generation circuit 40 may generate the syndrome signal SYN<1:4> by performing a logical operation on data bits included in the first and second read data RD1<1:5>, RD2<1:5> in response to the selection signal SEL and the reset signal RST. For example, the syndrome signal SYN<1:4> may be generated by an error correction code (ECC) circuit using a Hamming code. In an embodiment, the syndrome generation circuit 40, may include an error correction code (ECC) circuit using a Hamming code for generating the error correction code. The Hamming code may be implemented by matrices (see for example FIG. 9) for correcting errors of data. The syndrome signal SYN<1:4> may include location information regarding erroneous bits among the data bits in the first and second output data DO1<1:3>, DO2<1:3>. A method of making the matrices shown in FIG. 9 will be described later in detail with reference to drawings.

During the second read operation, the data correction circuit 50 may utilize the syndrome signal SYN<1:4> to correct erroneous data of the first and second output data DO1<1:3>, DO2<1:3>. The data correction circuit 50 may combine the first and second output data DO1<1:3>, DO2<1:3> corrected during the second read operation, and may output the combined data as corrected data DC<1:6>.

Figure 2:
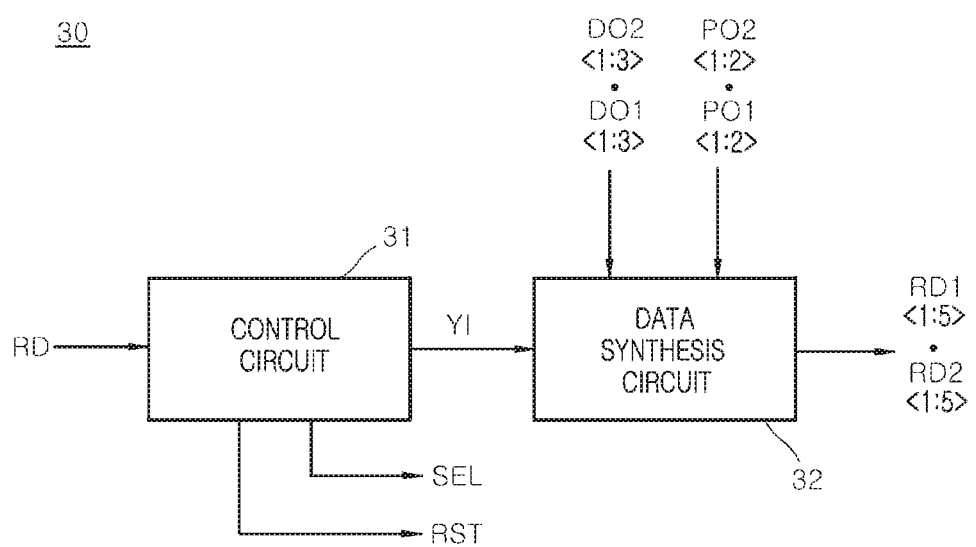
FIG. 2 is a block diagram illustrating a configuration of a read data generation circuit included in the semiconductor device of FIG. 1.

Referring to FIG. 2, the read data generation circuit 30 may include a control circuit 31 and a data synthesis circuit 32.

Figure 3:
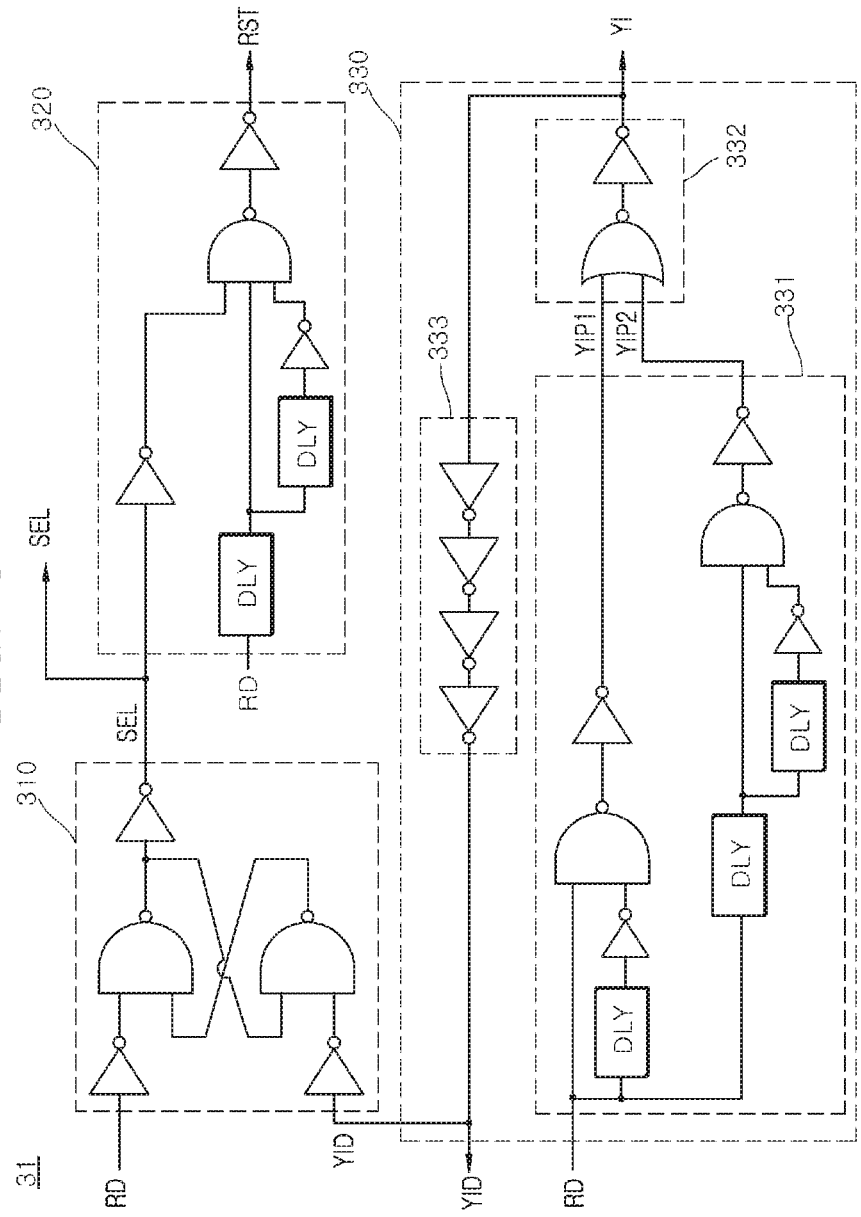
FIG. 3 is a circuit diagram illustrating a configuration of a control circuit included in the read data generation circuit of FIG. 2.

The control circuit 31 may generate the selection signal SEL in response to the read signal RD and a column delay signal (YID of FIG. 3). The selection signal SEL may be enabled in response to the read signal RD and disabled in response to the column delay signal YID. The control circuit 31 may generate the reset signal RST in response to the read signal RD and the selection signal SEL. For example, the reset signal RST may be enabled in response to the read signal RD and disabled in response to the selection signal SEL. The control circuit 31 may generate a column signal YI including a first pulse and a second pulse made in response to the read signal RD.

The data synthesis circuit 32 may generate the first read data RD1<1:5> based at least on the first output data DO1<1:3> and the first output parity PO1<1:2> in response to the column signal YI and may generate the second read data RD2<1:5> based at least on the second output data DO2<1:3> and the second output parity PO2<1:2> in response to the column signal YI. The data synthesis circuit 32 may combine (or synthesize) the first output data DO1<1:3> and the first output parity PO1<1:2> in response to the first pulse of the column signal YI to output the first read data RD1<1:5>. The data synthesis circuit 32 may generate the first read data RD1<1:5> by combining the first output data DO1<1:3> and the first output parity PO1<1:2> in response to the first pulse of the column signal YI. The data synthesis circuit 32 may generate the second read data RD2<1:5> from the second output data DO2<1:3> and the second output parity PO2<1:2> in response to the second pulse of the column signal YI. The data synthesis circuit 32 may generate the second read data RD2<1:5> by combining (or synthesizing) the second output data DO2<1:3> and the second output parity PO2<1:2> in response to the second pulse of the column signal YI.

Referring to FIG. 3, the control circuit 31 may include a selection signal generation circuit 310, a reset signal generation circuit 320 and a column signal generation circuit 330.

The selection signal generation circuit 310 may generate the selection signal SEL In response to the read signal RD and the column delay signal YID. The selection signal generation circuit 310 may generate the selection signal SEL having a logic "low" level at a time when the read signal RD having a logic "high" level is entered to the selection signal generation circuit 310. The selection signal generation circuit 310 may generate the selection signal SEL having a logic "high" level at a time when the column delay signal YID having a logic "high" level is entered to the selection signal generation circuit 310.

The reset signal generation circuit 320 may generate the reset signal RST in response to the selection signal SEL and the read signal RD. The reset signal generation circuit 320 may generate the reset signal RST having a logic "high" level when the selection signal SEL has a logic "low" level and the read signal RD has a logic "high" level.

The column signal generation circuit 330 may include a pulse signal generation circuit 331, a column signal output circuit 332 and a delay circuit 333.

The pulse signal generation circuit 331 may generate a first pulse signal YIP1 and a second pulse signal YIP2 sequentially enabled in response to the read signal RD. When the read signal RD having a logic "high" level is entered to the pulse signal generation circuit 331, the pulse signal generation circuit 331 may output the first pulse signal YIP1 having a logic "high" level during a predetermined period, and the second pulse signal YIP2 having a logic "high" level during a predetermined period after the first pulse signal YIP1 Is outputted.

The column signal output circuit 332 may output the column signal YI including a first pulse and a second pulse generated in response to the first pulse signal YIP1 and the second pulse signal YIP2. The column signal output circuit 332 may perform a logical OR operation on the first pulse signal YIP1 and the second pulse signal YIP2 to generate the column signal YI. The column signal output circuit 332 may generate the column signal YI having a logic "high" level when one of the first pulse signal YIP1 and the second pulse signal YIP2 has a logic "high" level. The column signal output circuit 332 may output the first pulse signal YIP1 as the first pulse of the column signal YI. The column signal output circuit 332 may output the second pulse signal YIP2 as the second pulse of the column signal YI.

The delay circuit 333 may delay the column signal YI to generate the column delay signal YID. How long the delay circuit 333 delays the column signal YI, i.e., a delay time, may be determined differently according to various embodiments.

As described above, the control circuit 31 may generate the selection signal SEL having a logic "low" level when the read signal RD has a logic "high" level and may generate the selection signal SEL having a logic "high" level when the column delay signal YID has a logic "high" level. The control circuit 31 may generate the reset signal RST having a logic "high" level when the selection signal SEL has a logic "low" level and the read signal RD has a logic "high" level. The control circuit 31 may output the column signal YI including the first and second pulses which are sequentially generated when the read signal RD has a logic "high" level.

Figure 4:
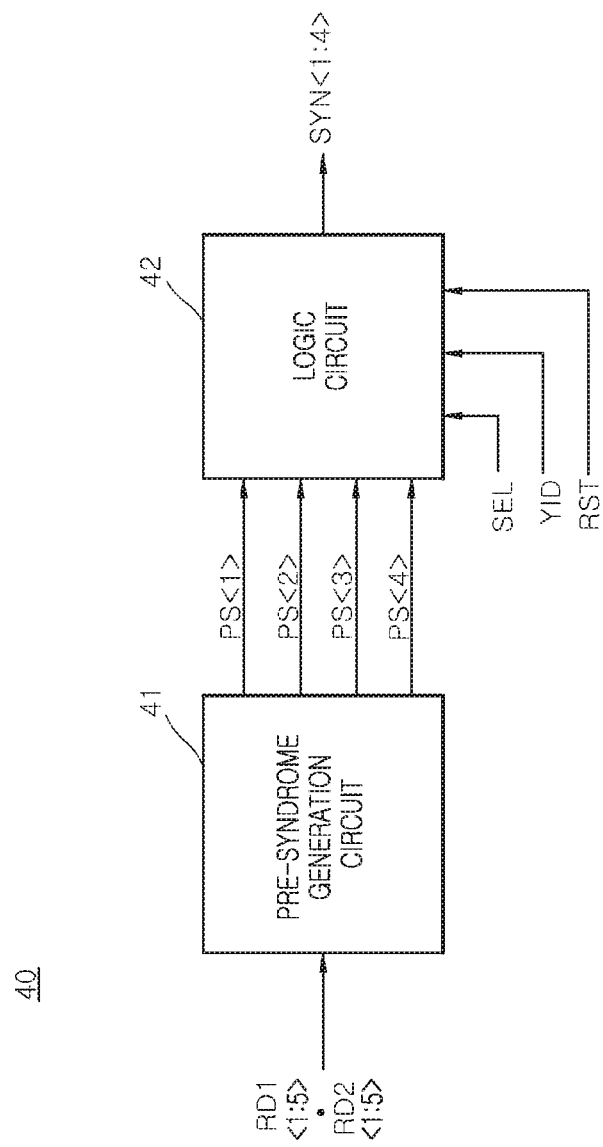
FIG. 4 is a block diagram illustrating a configuration of a syndrome generation circuit included in the semiconductor device of FIG. 1.

Referring to FIG. 4, the syndrome generation circuit 40 may include a pre-syndrome generation circuit 41 and a logic circuit 42.

The pre-syndrome generation circuit 41 may perform a logical operation on data bits included in the first read data RD1<1:5>, generated during the first read operation, to generate first to fourth pre-syndromes PS<1:4>. The pre-syndrome generation circuit 41 may perform a logical operation on data bits included in the second read data RD2<1:5>, generated during the second read operation, to generate the first to fourth pre-syndromes PS<1:4>. The first to fourth pre-syndromes PS<1:4> may include error information about the first read data RD1<1:5> and the second read data RD2<1:5>. The first to fourth pre-syndromes PS<1:4> generated during the first read operation may be established as a first pre-syndrome group. The first to fourth pre-syndromes PS<1:4> generated during the second read operation may be determined as a second pre-syndrome group. The first to fourth pre-syndromes PS<1:4> may be considered a column vector of a matrix. By the way of example but not limitation, the matrix may be provided by the pre-syndrome generation circuit 41 to generate syndromes used in the semiconductor device. The matrix will be described with reference to FIG. 9 later.

The logic circuit 42 may store the first to fourth pre-syndromes PS<1:4>, generated during the first read operation, as the syndrome signal SYN<1:4>, i.e., first to fourth syndromes SYN<1:4>, in response to the selection signal SEL. The logic circuit 42 may assign the first to fourth pre-syndromes PS<1:4>, generated during the first read operation, as the first to fourth syndromes SYN<1:4> when the selection signal SEL has a logic "low" level. To generate the first to fourth syndromes SYN<1:4>, the logic circuit 42 may change an array sequence of the first to fourth pre-syndromes PS<1:4> generated during the second read operation in response to the selection signal SEL and perform a logical operation on the first to fourth pre-syndromes PS<1:4> rearranged according to the changed array sequence and the first to fourth syndromes SYN<1:4> generated during the first read operation. The logic circuit 42 may generate the first to fourth syndromes SYN<1:4> initialized in response to the reset signal RST.

Figure 5:
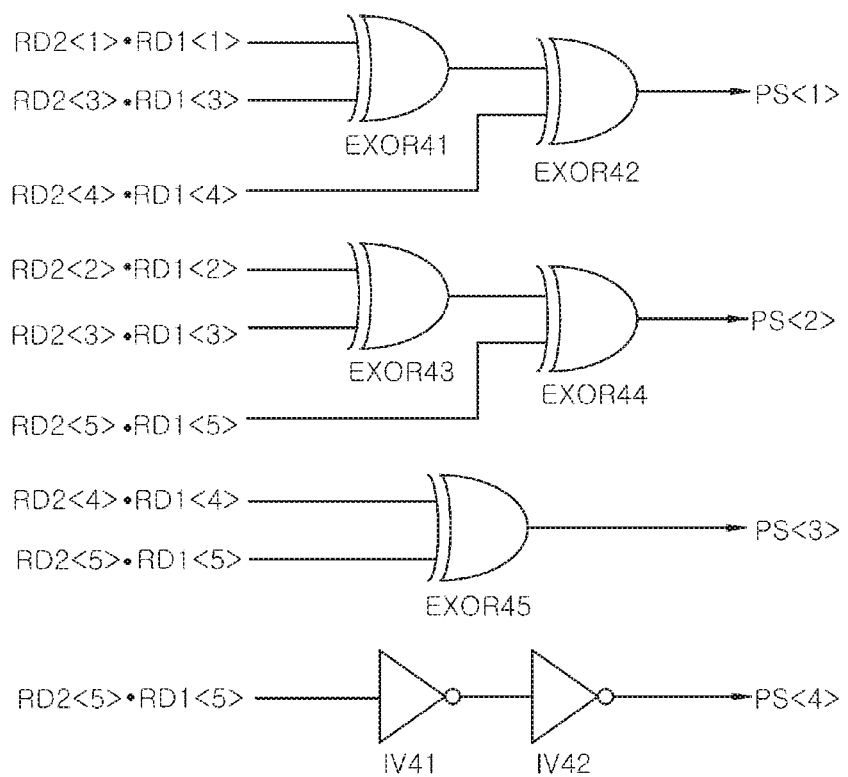
FIG. 5 is a circuit diagram illustrating a configuration of a pre-syndrome generation circuit included in the syndrome generation circuit of FIG. 4.

A configuration and an operation of the pre-syndrome generation circuit 41 will be described hereinafter with reference to FIG. 5.

The pre-syndrome generation circuit 41 may be implemented in a formation comprising a plurality of exclusive OR gates EXOR41, EXOR42, EXOR43, EXOR44, EXOR45 and a plurality of inverters IV41, IV42.

According to an example, the first to fourth pre-syndromes PS<1:4> may be generated during the first read operation as follows.

The pre-syndrome generation circuit 41 may generate the first pre-syndrome PS<1> by performing a logical exclusive OR operation on the first bit datum RD1<1>, the third bit datum RD1<3> and the fourth bit datum RD1<4> included in the first read data RD1<1:5> through the exclusive OR gates EXOR41, EXOR42.

The pre-syndrome generation circuit 41 may generate the second pre-syndrome PS<2> by performing a logical exclusive OR operation on the second bit datum RD1<2>, the third bit datum RD1<3> and the fifth bit datum RD1<5> included in the first read data RD1<1:5> through the exclusive OR gates EXOR43, EXOR44.

The pre-syndrome generation circuit 41 may generate the third pre-syndrome PS<3> by performing a logical exclusive OR operation on the fourth bit datum RD1<4> and the fifth bit datum RD1<5> included in the first read data RD1<1:5> through the exclusive OR gate EXOR45.

The pre-syndrome generation circuit 41 may generate the fourth pre-syndrome PS<4> by buffering the fifth bit datum RD1<5> of the first read data RD1<1:5> through even number of the inverters, e.g. inverters IV41 and IV42.

The first to fourth pre-syndromes PS<1:4> may be generated during the second read operation as follows.

The pre-syndrome generation circuit 41 may generate the first pre-syndrome PS<1> by performing a logical exclusive OR operation on the first bit datum RD2<1>, the third bit datum RD2<3> and the fourth bit datum RD2<4> included in the second read data RD2<1:5> through the exclusive OR gates EXOR41, EXOR42.

To generate the second pre-syndrome PS<2>, the pre-syndrome generation circuit 41 may perform a logical exclusive OR operation on the second bit datum RD2<2>, the third bit datum RD2<3> and the fifth bit datum RD2<5> included in the second read data RD2<1:5> through the exclusive OR gates EXOR43, EXOR44.

The pre-syndrome generation circuit 41 may generate the third pre-syndrome PS<3> by performing a logical exclusive OR operation on the fourth bit datum RD2<4> and the fifth bit datum RD2<5> included in the second read data RD2<1:5> through the exclusive OR gate EXOR45.

The pre-syndrome generation circuit 41 may generate the fourth pre-syndrome PS<4> by buffering the fifth bit datum RD2<5> of the second read data RD2<1:5> through an even number of inverters e.g., inverters IV41 and IV42.

Figure 6:
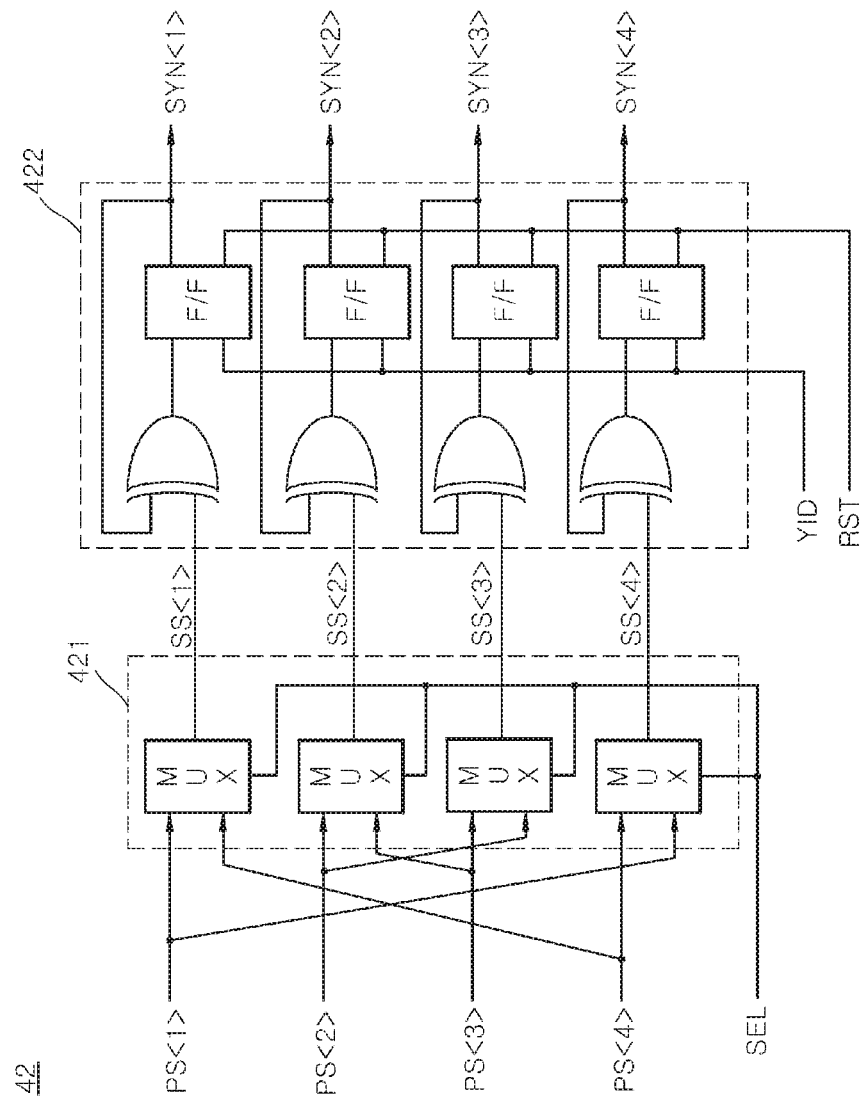
FIG. 6 is a circuit diagram illustrating a configuration of a logic circuit included in the syndrome generation circuit of FIG. 4.

A configuration and an operation of the logic circuit 42 will be described hereinafter with reference to FIG. 6.

The logic circuit 42 may include a selection syndrome generation circuit 421 and a syndrome storage circuit 422.

The selection syndrome generation circuit 421 may output the first to fourth pre-syndromes PS<1:4> as first to fourth selection syndromes SS<1:4> respectively, or may change an array sequence of the first to fourth pre-syndromes PS<1:4> to output the first to fourth pre-syndromes PS<1:4> rearranged by the changed array sequence as the first to fourth selection syndromes SS<1:4> respectively, in response to the selection signal SEL.

More specifically, when the selection signal SEL has a logic "low" level, the selection syndrome generation circuit 421 may output the first pre-syndrome PS<1> as the first selection syndrome SS<1>, output the second pre-syndrome PS<2> as the second selection syndrome SS<2>, output the third pre-syndrome PS<3> as the third selection syndrome SS<3>, and output the fourth pre-syndrome PS<4> as the fourth selection syndrome SS<4>. In addition, when the selection signal SEL has a logic "high" level, the selection syndrome generation circuit 421 may output the first pre-syndrome PS<1> as the fourth selection syndrome SS<4>, output the second pre-syndrome PS<2> as the third selection syndrome SS<3>, output the third pre-syndrome PS<3> as the second selection syndrome SS<2>, and output the fourth pre-syndrome PS<4> as the first selection syndrome SS<1>.

The syndrome storage circuit 422 may generate the first to fourth syndromes SYN<1:4> initialized in response to the reset signal RST. The first to fourth syndromes SYN<1:4> may be initialized to have a logic "low" level when the reset signal RST is enabled to have a logic "high" level. The syndrome storage circuit 422 may store the first to fourth selection syndromes SS<1:4>, generated during the first read operation, as the first to fourth syndromes SYN<1:4>, in response to the column delay signal YID. The syndrome storage circuit 422 may generate the first to fourth syndromes SYN<1:4> by performing a logical operation on the first to fourth syndromes SYN<1:4>, stored during the first read operation in response to the column delay signal YID, and the first to fourth selection syndromes SS<1:4> generated during the second read operation.

More specifically, when the column delay signal YID is generated to have a logic "high" level during the first read operation, the syndrome storage circuit 422 may store the first selection syndrome SS<1> as the first syndrome SYN<1>, store the second selection syndrome SS<2> as the second syndrome SYN<2>, store the third selection syndrome SS<3> as the third syndrome SYN<3>, and store the fourth selection syndrome SS<4> as the fourth syndrome SYN<4>.

When the column delay signal YID is generated to have a logic "high" level during the second read operation, the syndrome storage circuit 422 may generate the first syndrome SYN<1> by performing a logical exclusive OR operation on the first syndrome SYN<1>, stored during the first read operation, and the first selection syndrome SS<1>, generate the second syndrome SYN<2> by performing a logical exclusive OR operation on the second syndrome SYN<2>, stored during the first read operation, and the second selection syndrome SS<2>, generate the third syndrome SYN<3> by performing a logical exclusive OR operation on the third syndrome SYN<3>, stored during the first read operation, and the third selection syndrome SS<3>, and generate the fourth syndrome SYN<4> by performing a logical exclusive OR operation on the fourth syndrome SYN<4>, stored during the first read operation, and the fourth selection syndrome SS<4>.

Figure 7:
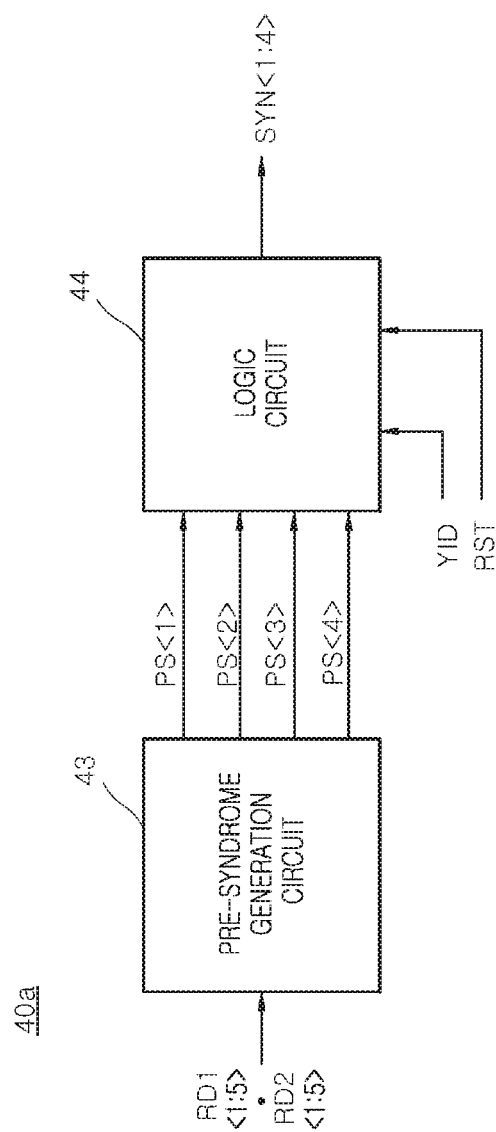
FIG. 7 is a block diagram illustrating another example of the syndrome generation circuit shown in FIG. 4.

Referring to FIG. 7, another example of a syndrome generation circuit 40a is provided. The syndrome generation circuit 40a may include a pre-syndrome generation circuit 43 and a logic circuit 44.

The pre-syndrome generation circuit 43 may perform a logical operation on data bits included in the first read data RD1<1:5> generated during the first read operation to generate the first to fourth pre-syndromes PS<1:4>. The pre-syndrome generation circuit 43 may perform a logical operation on data bits included in the second read data RD2<1:5>, generated during the second read operation, to generate the first to fourth pre-syndromes PS<1:4>. The first to fourth pre-syndromes PS<1:4> generated during the first read operation may be determined as the first pre-syndrome group. The first to fourth pre-syndromes PS<1:4> generated during the second read operation may be determined as the second pre-syndrome group. The pre-syndrome generation circuit 43 may be implemented using the same circuit as the pre-syndrome generation circuit 41 illustrated in FIG. 5. Thus, a detailed description of the pre-syndrome generation circuit 43 will be omitted hereinafter.

The logic circuit 44 may store the first to fourth pre-syndromes PS<1:4> generated during the first read operation as the first to fourth syndromes SYN<1:4>. To generate the first to fourth syndromes SYN<1:4>, the logic circuit 44 may change an array sequence of the first to fourth syndromes SYN<1:4> stored during the first read operation and perform a logical operation on the first to fourth syndromes SYN<1:4> rearranged according to the changed array sequence and the first to fourth pre-syndromes PS<1:4> generated during the second read operation. The logic circuit 44 may generate the first to fourth syndromes SYN<1:4> initialized in response to the reset signal RST.

Figure 8:
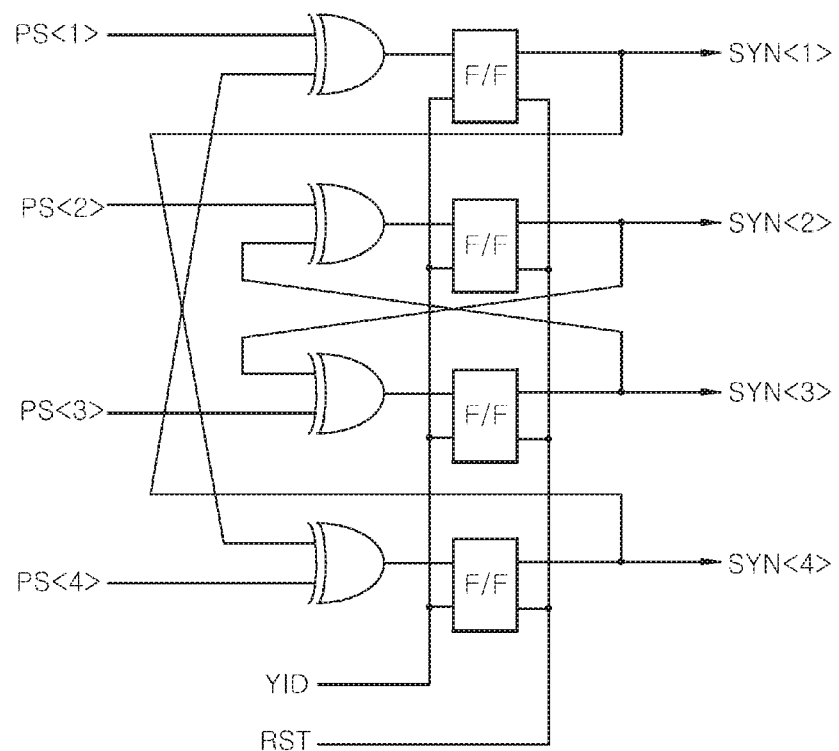
FIG. 8 is a circuit diagram illustrating a configuration of a logic circuit included in the syndrome generation circuit of FIG. 7.

More specifically, referring to FIG. 8, when the column delay signal YID is outputted to have a logic "high" level during the first read operation, the logic circuit 44 may store the first pre-syndrome PS<1> as the first syndrome SYN<1>, store the second pre-syndrome PS<2> as the second syndrome SYN<2>, store the third pre-syndrome PS<3> as the third syndrome SYN<3>, and store the fourth pre-syndrome PS<4> as the fourth syndrome SYN<4>.

When the column delay signal YID is generated to have a logic "high" level during the second read operation, the logic circuit 44 may generate the first syndrome SYN<1> by performing a logical exclusive OR operation on the fourth syndrome SYN<4> stored during the first read operation and the first pre-syndrome PS<1>, generate the second syndrome SYN<2> by performing a logical exclusive OR operation on the third syndrome SYN<3> stored during the first read operation and the second pre-syndrome PS<2>, generate the third syndrome SYN<3> by performing a logical exclusive OR operation on the second syndrome SYN<2> stored during the first read operation and the third pre-syndrome PS<3>, and generate the fourth syndrome SYN<4> by performing a logical exclusive OR operation on the first syndrome SYN<1> stored during the first read operation and the fourth pre-syndrome PS<4>.

A method of reducing an area of a circuit for extracting matrices through two read operations performed in a semiconductor device according to an embodiment will be described hereinafter with reference to FIG. 9. Matrices illustrated in FIG. 9 may be established by the pre-syndrome generation circuit 41.

Figure 9:
FIG. 9 illustrates matrices used in an embodiment of the present disclosure.

First, a full matrix illustrated in FIG. 9 is a matrix for generating first to fourth syndromes SYN<1:4> for correcting errors of first to sixth data D1~D6 of six bits. In the full matrix illustrated in FIG. 9, the first to third data D1~D3 may be considered the first output data DO1<1:3>, and the fourth to sixth data D4~D6 may be considered the second output data DO2<1:3>. In addition, parities P1 and P2 in the full matrix may correspond to a first bit and a second bit of the first output parity PO1<1:2>, respectively. Moreover, parities P3 and P4 in the full matrix may correspond to a first bit and a second bit of the second output parity PO2<1:2>, respectively.

A row vector for generating the first syndrome SYN<1> may be determined to perform a logical exclusive OR operation on the first parity P1, the first datum D1, the second datum D2 and the sixth datum D6.

A row vector for generating the second syndrome SYN<2> may be determined to perform a logical exclusive OR operation on the second parity P2, the first datum D1, the third datum D3, the fifth datum D5 and the sixth datum D6.

A row vector for generating the third syndrome SYN<3> may be determined to perform a logical exclusive OR operation on the third parity P3, the second datum D2, the third datum D3, the fourth datum D4 and the sixth datum D6.

A row vector for generating the fourth syndrome SYN<4> may be determined to perform a logical exclusive OR operation on the fourth parity P4, the third datum D3, the fourth datum D4 and the fifth datum D5.

A logic level combination of the first to fourth syndromes SYN<1:4> may include information on whether an erroneous bit is included in the first to sixth data D1~D6 and the first to fourth parities P1~P4. By the way of example but not limitation, when the first to fourth syndromes SYN<1:4> are generated to have a logic level combination of '1, 1, 0, 0' corresponding to a logic level combination of the fifth column vector of the full matrix, it may be determined that the first datum D1 is an erroneous datum.

Next, a first half matrix and a second half matrix for generating the first to fourth syndromes SYN<1:4> for correcting errors of the six-bit data D1~D6 with two read operations are also illustrated in FIG. 9.

A row vector for generating the first syndrome SYN<1> may include the first parity P1, the first datum D1, the second datum D2 and the sixth datum D6. The row vector for generating the first syndrome SYN<1> may include a first row vector of the first half matrix relating to the first read operation and a first row vector of the second half matrix relating to the second read operation. In such a case, the first row vector of the second half matrix may be identical to a fourth-row vector of the first half matrix.

A row vector for generating the second syndrome SYN<2> may include the second parity P2, the first datum D1, the third datum D3, the fifth datum D5 and the sixth datum D6. The row vector for generating the second syndrome SYN<2> may include a second row vector of the first half matrix relating to the first read operation and a second row vector of the second half matrix relating to the second read operation. In such a case, the second row vector of the second half matrix may be identical to a third row vector of the first half matrix.

A row vector for generating the third syndrome SYN<3> may include the third parity P3, the second datum D2, the third datum D3, the fourth datum D4 and the sixth datum D6. The row vector for generating the third syndrome SYN<3> may include the third row vector of the first half matrix relating to the first read operation and a third row vector of the second half matrix relating to the second read operation. In such a case, the third row vector of the second half matrix may be identical to the second row vector of the first half matrix.

A row vector for generating the fourth syndrome SYN<4> may include the fourth parity P3, the third datum D3, the fourth datum D4 and the fifth datum D5. The row vector for generating the fourth syndrome SYN<4> may include the fourth row vector of the first half matrix relating to the first read operation and a fourth row vector of the second half matrix relating to the second read operation. In such a case, the fourth row vector of the second half matrix may be identical to the first row vector of the first half matrix.

According to the descriptions, column vectors of the first half matrix may have a symmetric configuration to column vectors of the second half matrix. This may lead to reduction of an area of a circuit for setting the matrix for generating syndromes used in correction of data errors during two read operations.

Figure 10:
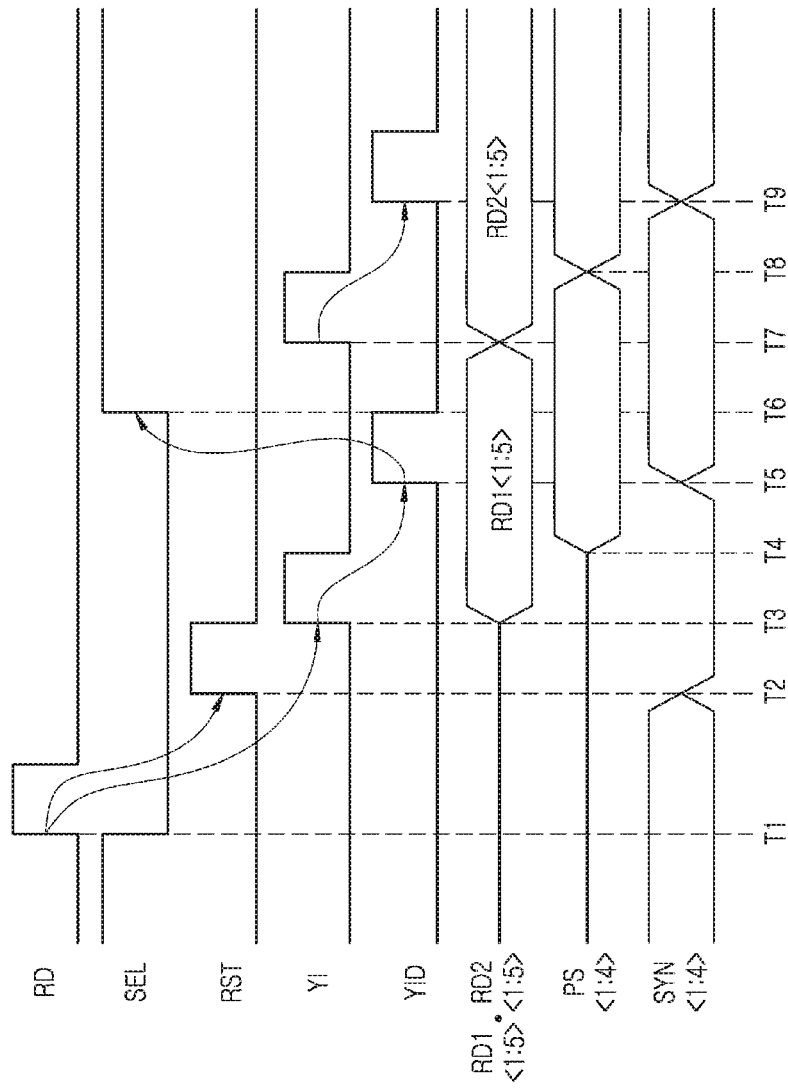
FIG. 10 is a timing diagram illustrating an operation of a semiconductor device according to an embodiment of the present disclosure.

A read operation of a semiconductor device will be described hereinafter with reference to FIG. 10 in conjunction with an example in which syndromes are generated using two read operations (i.e., the first and second operations) to correct erroneous data.

The read operation according to an embodiment is as follows.

When the read signal RD is inputted to the memory area 20 at a point of time "T1", the memory area 20 may output some, e.g., the input data DIN<1:3>, of the input data DIN<1:6> stored therein as the first output data DO1<1:3> and may output some, e.g., the parity PI<1:2>, of the parity PI<1:4> stored therein as the first output parity PO1<1:2>, in response to the read signal RD.

The selection signal generation circuit 310 of the control circuit 31 may generate the selection signal SEL enabled to have a logic "low" level in response to the read signal RD.

At a second timing T2, the reset signal generation circuit 320 of the control circuit 31 may generate the reset signal RST having a logic "high" level in response to the read signal RD and the selection signal SEL inputted at a first timingT1.

The logic circuit 42 may generate the first to fourth syndromes SYN<1:4> initialized to have a logic "low" level in response to the reset signals RST having a logic "high" level.

At a third timing T3, the column signal generation circuit 330 of the control circuit 31 may generate a first pulse of the column signal YI in response to the read signal RD which is entered at the first timing T1.

The data synthesis circuit 32 may generate the first read data RD1<1:5> from the first output data DO1<1:3> and the first output parity PO1<1:2> in response to the first pulse of the column signal YI.

At a fourth timing T4, the pre-syndrome generation circuit 41 may perform a logical operation on data bits included in the first read data RD1<1:5> to generate the first to fourth pre-syndromes PS<1:4>. The first to fourth pre-syndromes PS<1:4> generated during the first read operation may be determined as a first pre-syndrome group.

At a fifth timing T5, the column signal generation circuit 330 of the control circuit 31 may delay the pulse of the column signal YI generated at the third timing T3 to generate a first pulse of the column delay signal YID.

The logic circuit 42 may store the first to fourth pre-syndromes PS<1:4> as the first to fourth syndromes SYN<1:4> in response to the selection signal SEL having a logic "low" level and the first pulse of the column delay signal YID.

At a sixth timing T6, the selection signal generation circuit 310 of the control circuit 31 may generate the selection signal SEL disabled to have a logic "high" level in response to the first pulse of the column delay signal YID generated at the fifth timing T5.

At a seventh timing T7, the column signal generation circuit 330 of the control circuit 31 may generate a second pulse of the column signal YI in response to the read signal RD inputted at the point of time "T1".

The data synthesis circuit 32 may generate the second read data RD2<1:5> from the second output data DO2<1:3> and the second output parity PO2<1:2> in response to the second pulse of the column signal YI.

At an eighth timing T8, the pre-syndrome generation circuit 41 may perform a logical operation on data bits included in the second read data RD2<1:5> to generate the first to fourth pre-syndromes PS<1:4>. The first to fourth pre-syndromes PS<1:4> generated during the second read operation may be determined as a second pre-syndrome group.

The logic circuit 42 may change an array sequence of the first to fourth pre-syndromes PS<1:4> in response to the selection signal SEL having a logic "high" level.

At a ninth timing T9, the column signal generation circuit 330 of the control circuit 31 may delay the second pulse of the column signal YI generated at the seventh timing T7 to generate a second pulse of the column delay signal YID.

The logic circuit 42 may generate the first to fourth syndromes SYN<1:4> by performing a logical operation of the first to fourth pre-syndromes PS<1:4> rearranged by the changed array sequence at the eighth timing T8 and the first to fourth syndromes SYN<1:4> stored at the fifth timing T5, in response to the second pulse of the column delay signal YID.

As described above, a semiconductor device may adjust two half matrices generating syndromes for correcting data errors during two read operations so that column vectors of a first half matrix of the two half matrices are symmetric with respect to column vectors of a second half matrix of the two half matrices. As a result, an area allocating for a circuit configured to establish the matrices may be reduced.

Figure 11:
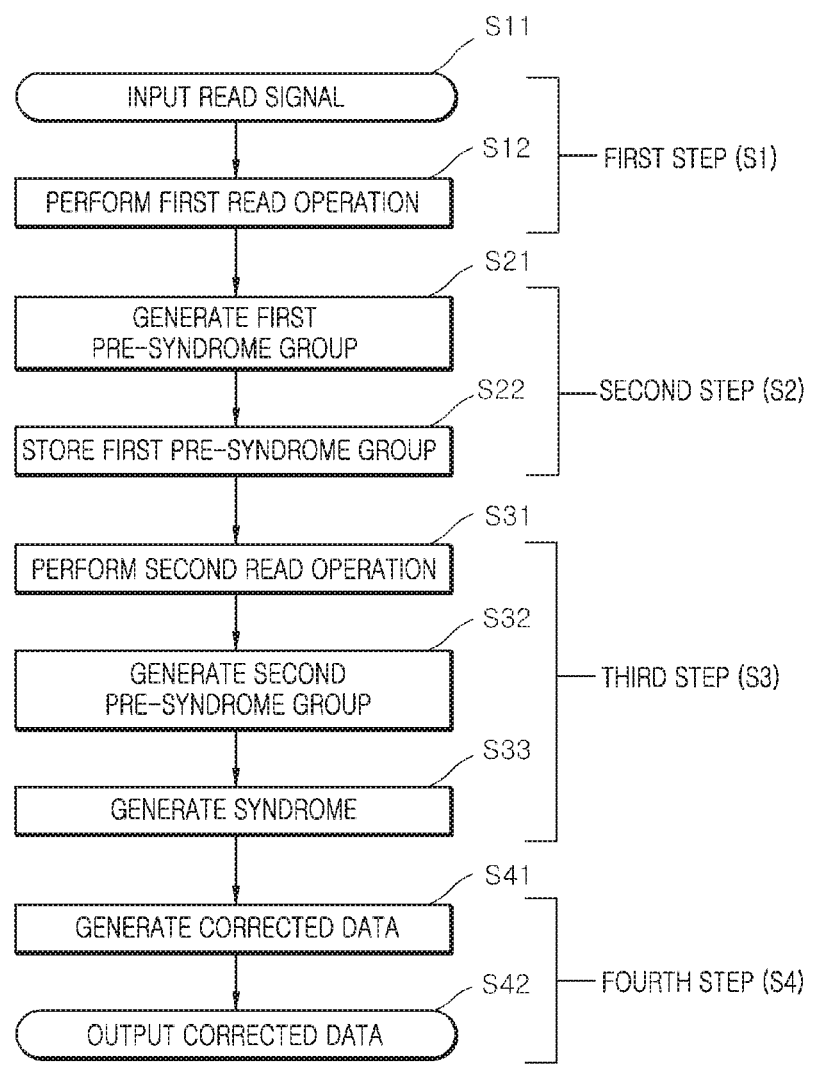
FIG. 11 is a flowchart illustrating an error correction method according to an embodiment of the present disclosure.

An error correction method according to an embodiment will be described hereinafter with reference to FIG. 11.

The error correction method may include a first step S1, a second step S2, a third step S3 and a fourth step S4.

The first step S1 of the error correction method may include a step S11 of inputting the read signal RD and a step S12 of performing the first read operation.

The step S11 may be a step that the read signal RD is inputted to generate a first pulse of the column signal YI.

The step S12 may be a step that the first read data RD1<1:5> is generated by the first pulse of the column signal YI from the first output data DO1<1:3> and the first output parity PO1<1:2> outputted from the memory area 20 during the first read operation.

The second step S2 may include a step S21 of generating a first pre-syndrome group and a step S22 of storing the first pre-syndrome group.

The step S21 may be a step of generating the first to fourth pre-syndromes PS<1:4> including failure information on the first read data RD1<1:5>. The first to fourth pre-syndromes PS<1:4> generated during the first read operation may be determined as the first pre-syndrome group.

The step S22 may be a step of storing the first to fourth pre-syndromes PS<1:4> as the first to fourth syndromes SYN<1:4>.

The third step S3 may include a step S31 of performing the second read operation, a step S32 of generating a second pre-syndrome group, and a step S33 of generating the syndromes.

The step S31 may be a step that the second read data RD2<1:5> is generated by a second pulse of the column signal YI from the second output data DO2<1:3> and the second output parity PO2<1:2> outputted from the memory area 20 during the second read operation.

The step S32 may include generating the first to fourth pre-syndromes PS<1:4> including failure information regarding the second read data RD2<1:5> and adjusting an array sequence of the first to fourth pre-syndromes PS<1:4> so that column vectors in a matrix are symmetric to each other. The first to fourth pre-syndromes PS<1:4> generated during the second read operation may be determined as the second pre-syndrome group.

The step S33 may include performing a logical operation of the first to fourth syndromes SYN<1:4> stored at the step S22 and the first to fourth pre-syndromes PS<1:4> rearranged by the adjusted array sequence to generate the first to fourth syndromes SYN<1:4>.

The fourth step S4 may include a step S41 of generating corrected data and a step S42 of outputting the corrected data.

The step S41 may be a step of correcting erroneous data of the first output data DO1<1:3> and the second output data DO2<1:3> according to the first to fourth syndromes SYN<1:4> and of synthesizing the corrected first output data DO1<1:3> and the corrected second output data DO2<1:3> to generate corrected data DC<1:6>.

The step S42 may be a step of outputting the corrected data DC<1:6>.

As described above, an error correction method according to an embodiment may adjust an array sequence of column vectors in a matrix determined to generate syndromes for correcting data errors during the second read operation so that column vectors in a matrix determined during the first read operation are symmetric to column vectors in the matrix determined during the second read operation. As a result, an area needed for a circuit for establishing the matrices may be reduced.

Figure 12:
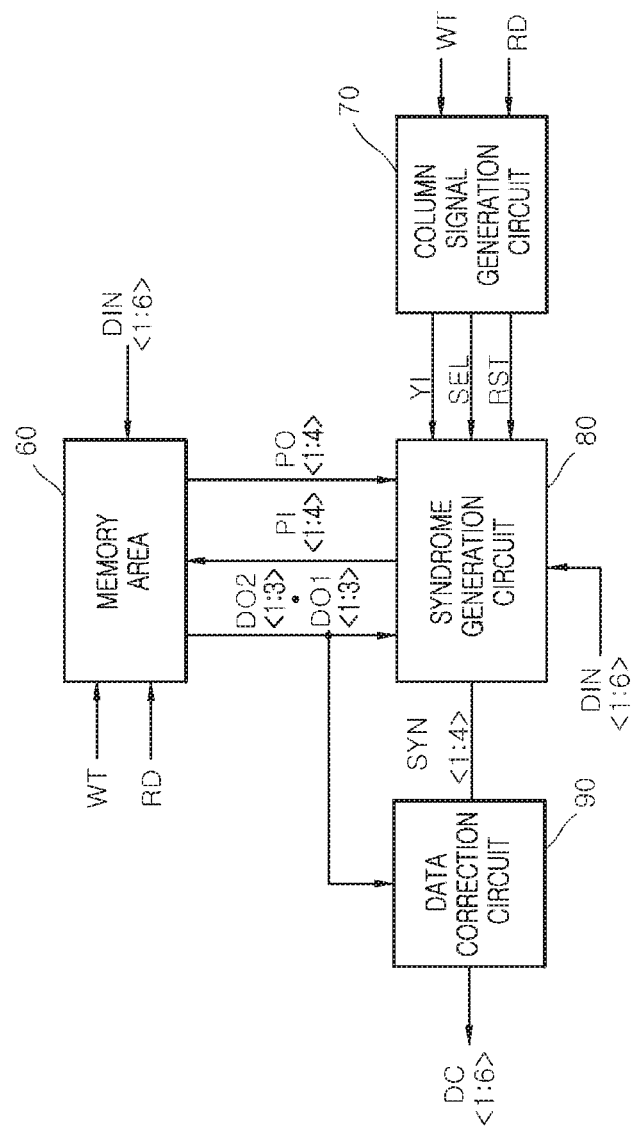
FIG. 12 is a block diagram illustrating a configuration of a semiconductor device according to another embodiment of the present disclosure.

As illustrated in FIG. 12, a semiconductor device may include a memory area 60, a column signal generation circuit 70, a syndrome generation circuit 80 and a data correction circuit 90.

The memory area 60 may store input data DIN<1:6> and a parity PI<1:4> during a write operation. The memory area 60 may store the input data DIN<1:6> and the parity PI<1:4> in response to a write signal WT entered to the memory area 60 during the write operation. The memory area 60 may store the input data DIN<1:3> of the input data DIN<1:6> into a first memory area of the memory area 60 in response to the write signal WT. The memory area 60 may store the input data DIN<4:6> of the input data DIN<1:6> into a second memory area of the memory area 60 in response to the write signal WT. The input data DIN<1:3> may be determined as first input data, and the input data DIN<4:6> may be determined as second input data. The first memory area and the second memory area may be arranged as two different memory spaces in the memory area 60. The first and second memory areas may be considered as memory areas where data are stored. The memory area 60 may store the parity PI<1:2> of the parity PI<1:4> into a third memory area of the memory area 60 in response to the write signal WT. The memory area 60 may store the parity PI<3:4> of the parity PI<1:4> into a fourth memory area of the memory area 60 in response to the write signal WT. The third memory area and the fourth memory area may be occupied two different and separate memory spaces in the memory area 60. The third and fourth memory areas may be determined as memory areas where a parity is stored.

The memory area 60 may output the first input data DIN<1:3> stored in the first memory area as first output data DO1<1:3> during a first read operation. The memory area 60 may output the first input data DIN<1:3> stored in the first memory area as the first output data DO1<1:3> In response to a read signal RD. The memory area 60 may output the second input data DIN<4:6> stored in the second memory area as second output data DO2<1:3> during a second read operation. The memory area 60 may output the second input data DIN<4:6> stored in the second memory area as the second output data DO2<1:3> in response to the read signal RD. The memory area 60 may output the parity PI<1:4> stored therein as output parity PO<1:4> in response to the read signal RD. Two read operations, i.e., the first read operation and the second read operation, may be sequentially performed by a single control signal activated or enabled only once, i.e., the read signal RD inputted to the memory area 60.

The column signal generation circuit 70 may generate a column signal YI including a first pulse and a second pulse which are sequentially made in response to the write signal WT or the read signal RD. The column signal generation circuit 70 may generate a selection signal SEL enabled in response to the write signal WT or the read signal RD. The column signal generation circuit 70 may generate a reset signal RST which is enabled in response to the write signal WT or the read signal RD.

The syndrome generation circuit 80 may generate the parity PI<1:4> from the input data DIN<1:6> during the write operation. The syndrome generation circuit 80 may generate a syndrome signal including first to fourth syndromes SYN<1:4> from the first output data DO1<1:3>, the second output data DO2<1:3> and the output parity PO<1:4> during the read operation. The syndrome generation circuit 80 may generate the syndrome signal SYN<1:4> from the first output data DO1<1:3>, the second output data DO2<1:3> and the output parity PO<1:4> using the first and second half matrices illustrated in FIG. 9. The syndrome generation circuit 80 may generate the syndrome signal SYN<1:4> by performing a logical operation on bit data of the first output data DO1<1:3>, bit data of the second output data DO2<1:3> and bit data of the output parity PO<1:4>, in response to the selection signal SEL and the reset signal RST. The syndrome signal SYN<1:4> may be generated by an error correction code (ECC) circuit using a Hamming code. The Hamming code may be implemented by a matrix for correcting errors of data. The syndrome signal SYN<1:4> may include location information on erroneous bits in the first and second output data DO1<1:3>, DO2<1:3>.

The data correction circuit 90 may correct errors of the first and second output data DO1<1:3>, DO2<1:3> using the syndrome signal SYN<1:4> during the second read operation. The data correction circuit 90 may merge the first and second output data DO1<1:3>, DO2<1:3>, previously corrected, to output the synthesized data as corrected data DC<1:6>.

Figure 13:
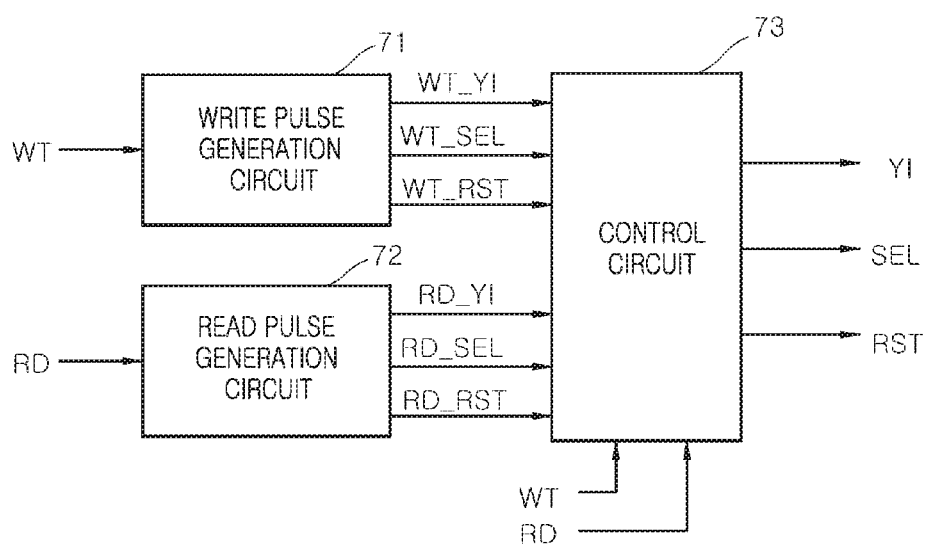
FIG. 13 is a block diagram illustrating a configuration of a column signal generation circuit include in the semiconductor device of FIG. 12.

Referring to FIG. 13, the column signal generation circuit 70 may include a write pulse generation circuit 71, a read pulse generation circuit 72 and a control circuit 73.

The write pulse generation circuit 71 may generate a write column signal WT_YI including a first pulse and a second pulse, both sequentially made in response to the write signal WT. The write pulse generation circuit 71 may generate a write selection signal WT_SEL and a write reset signal WT_RST enabled in response to the write signal WT. The write pulse generation circuit 71 may generate the write selection signal WT_SEL in response to the write signal WT and a write column delay signal (WT_YID of FIG. 14). The write pulse generation circuit 71 may generate the write selection signal WT_SEL enabled in response to the write signal WT and disabled in response to the write column delay signal WT_YID. The write pulse generation circuit 71 may generate the write reset signal WT_RST in response to the write signal WT and the write selection signal WT_SEL.

The read pulse generation circuit 72 may generate a read column signal RD_YI Including a first pulse and a second pulse which are sequentially made in response to the read signal RD. The read pulse generation circuit 72 may generate a read selection signal RD_SEL and a read reset signal RD_RST enabled in response to the read signal RD. The read pulse generation circuit 72 may generate the read selection signal RD_SEL in response to the read signal RD and a read column delay signal (RD_YID of FIG. 15). The read pulse generation circuit 72 may generate the read selection signal RD_SEL enabled in response to the read signal RD and disabled in response to the read column delay signal RD_YID. The read pulse generation circuit 72 may generate the read reset signal RD_RST in response to the read signal RD and the read selection signal RD_SEL.

The control circuit 73 may output one of the write column signal WT_YI and the read column signal RD_YI as the column signal YI in response to the write signal WT and the read signal RD. The control circuit 73 may output either the write selection signal WT_SEL or the read selection signal RD_SEL as the selection signal SEL in response to the write signal WT and the read signal RD. The control circuit 73 may generate the reset signal RST enabled in response to the write reset signal WT_RST or the read reset signal RD_RST. The control circuit 73 may generate the reset signal RST enabled when either the write reset signal WT_RST or the read reset signal RD_RST is enabled.

Figure 14:
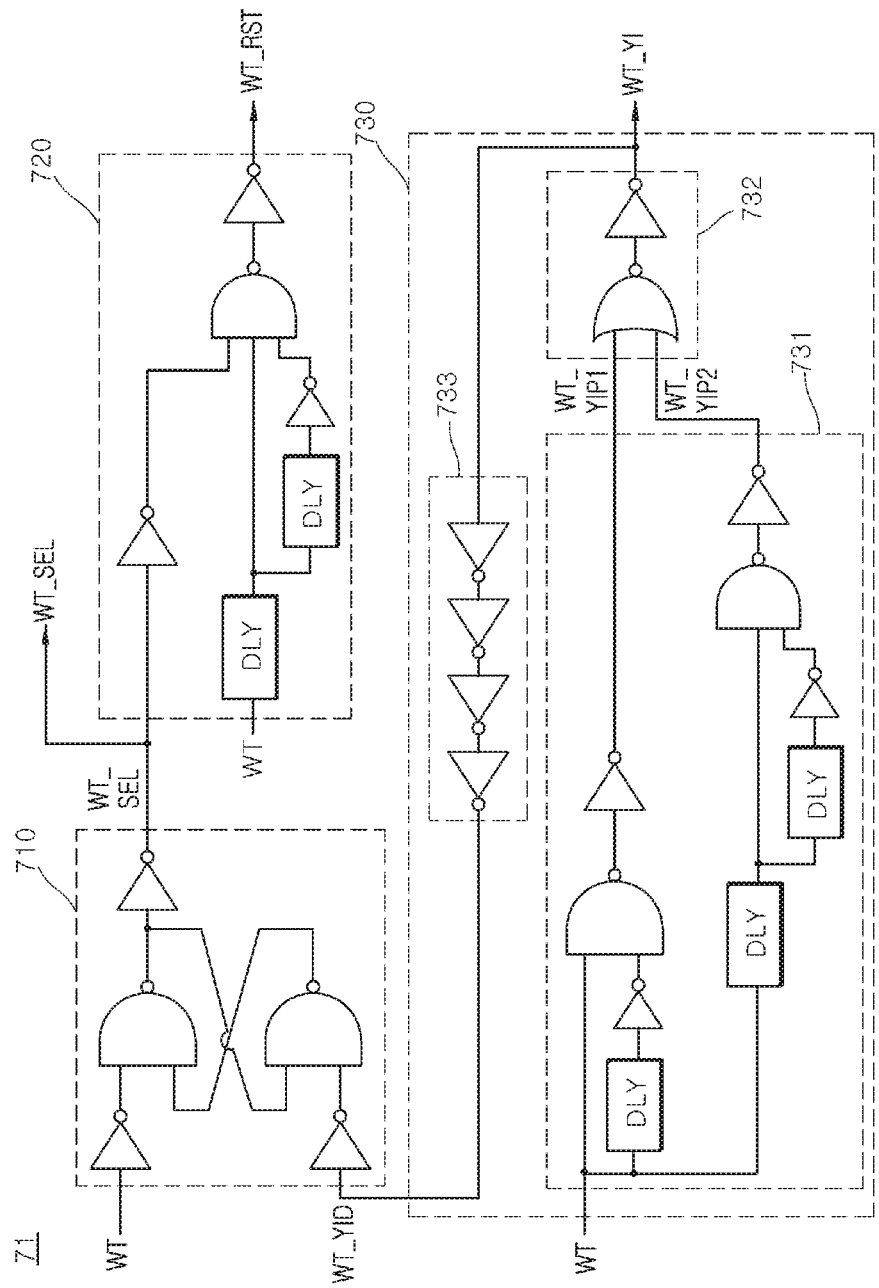
FIG. 14 is a circuit diagram illustrating a configuration of a write pulse generation circuit included in the column signal generation circuit of FIG. 13.

Referring to FIG. 14, the write pulse generation circuit 71 may include a write selection signal generation circuit 710, a write reset signal generation circuit 720 and a write column signal generation circuit 730.

The write selection signal generation circuit 710 may generate the write selection signal WT_SEL in response to the write signal WT and the write column delay signal WT_YID. The write selection signal generation circuit 710 may generate the write selection signal WT_SEL having a logic "low" level at a timing when the write signal WT having a logic "high" level is inputted to the write selection signal generation circuit 710. The write selection signal generation circuit 710 may generate the write selection signal WT_SEL having a logic "high" level at a timing when the write column delay signal WT_YID having a logic "high" level is entered to the write selection signal generation circuit 710.

The write reset signal generation circuit 720 may generate the write reset signal WT_RST in response to the write selection signal WT_SEL and the write signal WT. The write reset signal generation circuit 720 may generate the write reset signal WT_RST having a logic "high" level when the write selection signal WT_SEL has a logic "low" level and the write signal WT has a logic "high" level.

The write column signal generation circuit 730 may include a first pulse signal generation circuit 731, a write column signal output circuit 732 and a first delay circuit 733.

The first pulse signal generation circuit 731 may generate a first write pulse signal WT_YIP1 and a second write pulse signal WT_YIP2 sequentially enabled in response to the write signal WT. When the write signal WT having a logic "high" level is inputted to the first pulse signal generation circuit 731, the first pulse signal generation circuit 731 may generate the first write pulse signal WT_YIP1 enabled to have a logic "high" level during a predetermined period and the second write pulse signal WT_YIP2 enabled to have a logic "high" level during another predetermined period after the first write pulse signal WT_YIP1 is generated.

The write column signal output circuit 732 may generate the write column signal WT_YI including a first pulse and a second pulse which are made in response to the first write pulse signal WT_YIP1 and the second write pulse signal WT_YIP2. The write column signal output circuit 732 may perform a logical OR operation of the first write pulse signal WT_YIP1 and the second write pulse signal WT_YIP2 to generate the write column signal WT_YI. The write column signal output circuit 732 may generate the write column signal WT_YI having a logic "high" level when either the first write pulse signal WT_YIP1 or the second write pulse signal WT_YIP2 is generated to have a logic "high" level. The write column signal output circuit 732 may output the first write pulse signal WT_YIP1 as the first pulse of the write column signal WT_YI. The write column signal output circuit 732 may output the second write pulse signal WT_YIP2 as the second pulse of the write column signal WT_YI.

The first delay circuit 733 may delay the write column signal WT_YI to generate the write column delay signal WT_YID. A delay time of the first delay circuit 733 for delaying the write column signal WT_YI may be determined differently according to an exemplary semiconductor device.

As described above, the write pulse generation circuit 71 may generate the write selection signal WT_SEL having a logic "low" level when the write signal WT has a logic "high" level and may generate the write selection signal WT_SEL having a logic "high" level at a timing when the write column delay signal WT_YID has a logic "high" level. The write pulse generation circuit 71 may generate the write reset signal WT_RST having a logic "high" level when the write selection signal WT_SEL has a logic "low" level and the write signal WT has a logic "high" level. The write pulse generation circuit 71 may generate the write column signal WT_YI including the first and second pulses sequentially made when the write signal WT has a logic "high" level.

Figure 15:
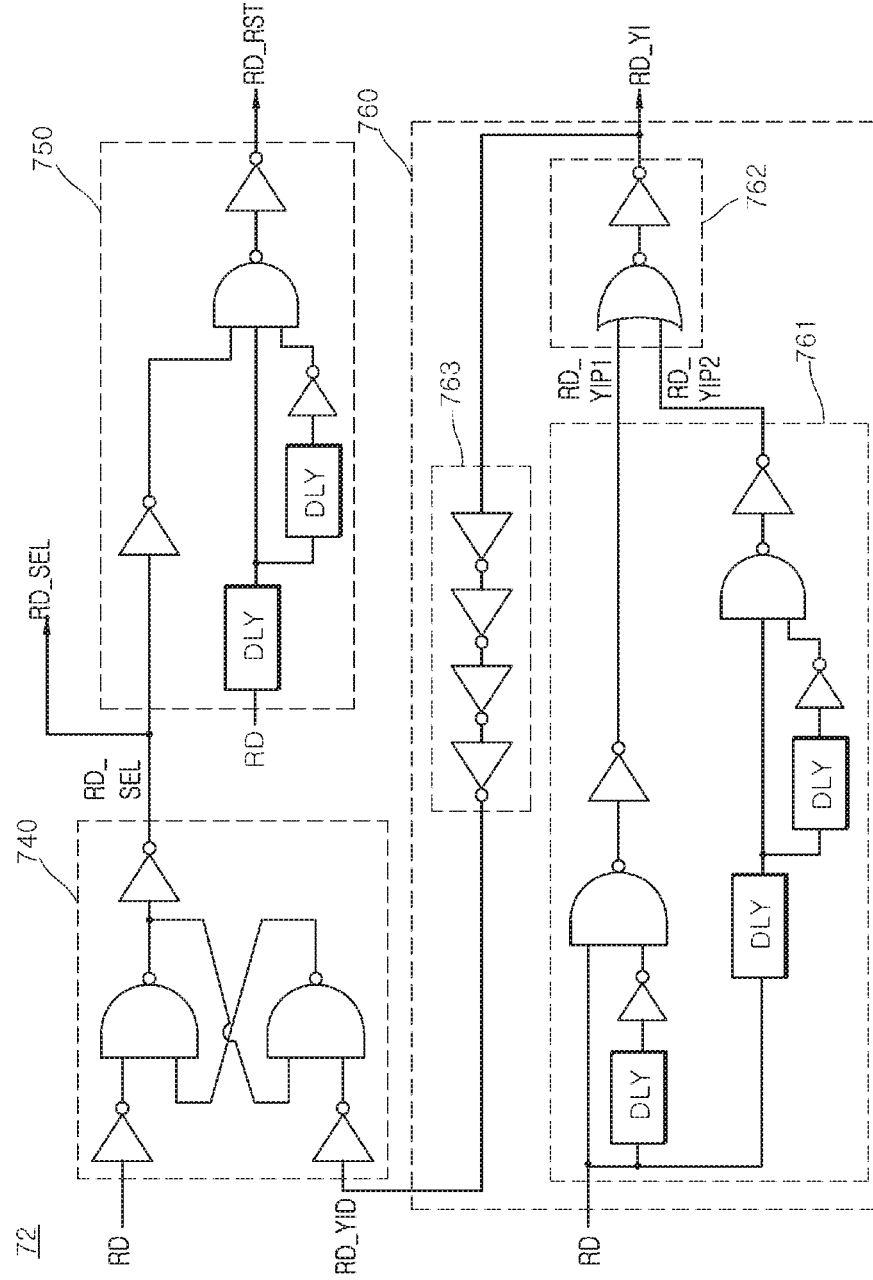
FIG. 15 is a circuit diagram illustrating a configuration of a read pulse generation circuit included in the column signal generation circuit of FIG. 13.

Referring to FIG. 15, the read pulse generation circuit 72 may include a read selection signal generation circuit 740, a read reset signal generation circuit 750 and a read column signal generation circuit 760.

The read selection signal generation circuit 740 may generate the read selection signal RD_SEL in response to the read signal RD and the read column delay signal RD_YID. The read selection signal generation circuit 740 may generate the read selection signal RD_SEL having a logic "low" level at a timing when the read signal RD having a logic "high" level is inputted to the read selection signal generation circuit 740. The read selection signal generation circuit 740 may generate the read selection signal RD_SEL having a logic "high" level at a timing when the read column delay signal RD_YID having a logic "high" level is inputted to the read selection signal generation circuit 740.

The read reset signal generation circuit 750 may generate the read reset signal RD_RST in response to the read selection signal RD_SEL and the read signal RD. The read reset signal generation circuit 750 may generate the read reset signal RD_RST having a logic "high" level when the read selection signal RD_SEL has a logic "low" level but the read signal RD has a logic "high" level.

The read column signal generation circuit 760 may include a second pulse signal generation circuit 761, a read column signal output circuit 762 and a second delay circuit 763.

The second pulse signal generation circuit 761 may generate a first read pulse signal RD_YIP1 and a second read pulse signal RD_YIP2 which are sequentially enabled in response to the read signal RD. When the read signal RD having a logic "high" level is inputted to the second pulse signal generation circuit 761, the second pulse signal generation circuit 761 may generate the first read pulse signal RD_YIP1 which is enabled to have a logic "high" level during a predetermined period and the second read pulse signal RD_YIP2 enabled to have a logic "high" level during another predetermined period after the first read pulse signal RD_YIP1 is generated.

The read column signal output circuit 762 may generate the read column signal RD_YI including a first pulse and a second pulse made in response to the first read pulse signal RD_YIP1 and the second read pulse signal RD_YIP2. The read column signal output circuit 762 may perform a logical OR operation on the first read pulse signal RD_YIP1 and the second read pulse signal RD_YIP2 to generate the read column signal RD_YI. The rea column signal output circuit 762 may generate the read column signal RD_YI having a logic "high" level when either the first read pulse signal RD_YIP1 or the second read pulse signal RD_YIP2 is in a logic "high" level. The read column signal output circuit 762 may output the first read pulse signal RD_YIP1 as the first pulse of the read column signal RD_YI. The read column signal output circuit 762 may output the second read pulse signal RD_YIP2 as the second pulse of the read column signal RD_YI.

The second delay circuit 763 may delay the read column signal RD_YI to generate the read column delay signal RD_YID. A delay time of the second delay circuit 763 for delaying the read column signal RD_YI may be determined differently according to an exemplary semiconductor device.

As described above, the read pulse generation circuit 72 may generate the read selection signal RD_SEL having a logic "low" level when the rea signal RD has a logic "high" level and may generate the read selection signal RD_SEL having a logic "high" level at a timing when the read column delay signal RD_YID has a logic "high" level. The read pulse generation circuit 72 may generate the read reset signal RD_RST having a logic "high" level when the read selection signal RD_SEL has a logic "low" level and the read signal RD has a logic "high" level. The read pulse generation circuit 72 may generate the read column signal RD_YI including the first and second pulses which are sequentially made when the read signal RD has a logic "high" level.

Figure 16:
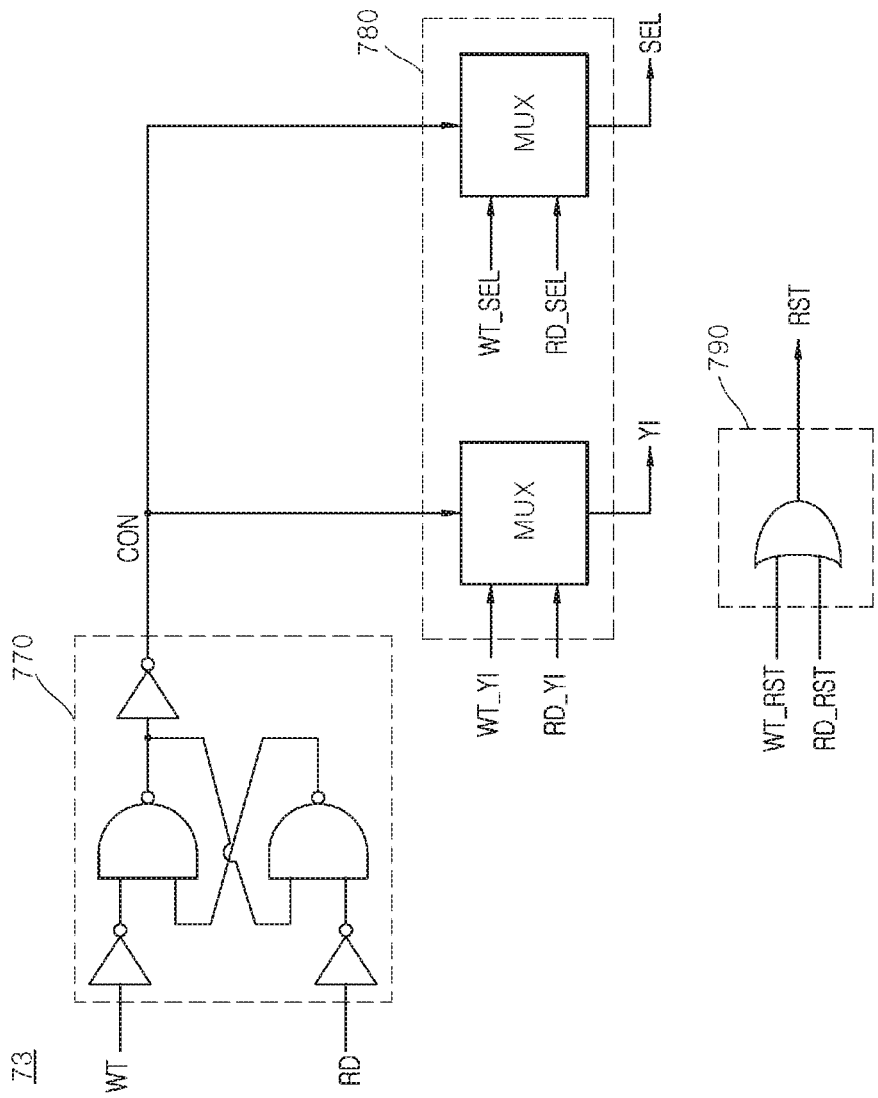
FIG. 16 is a circuit diagram illustrating a configuration of a control circuit included in the column signal generation circuit of FIG.

Referring to FIG. 16, the control circuit 73 may include a control signal generation circuit 770, a selection transmission circuit 780 and a reset signal generation circuit 790.

The control signal generation circuit 770 may generate a control signal CON which is enabled in response to the write signal WT and a read signal RD. The control signal generation circuit 770 may generate the control signal CON having a logic "high" level at a timing when the write signal WT having a logic "high" level is inputted to the control signal generation circuit 770. The control signal generation circuit 770 may generate the control signal CON having a logic "low" level at a timing when the read signal RD having a logic "high" level is inputted to the control signal generation circuit 770.

The selection transmission circuit 780 may output either the write column signal WT_YI or the read column signal RD_YI as the column signal YI in response to the control signal CON. The selection transmission circuit 780 may output the write column signal WT_YI as the column signal YI when the control signal CON has a logic "high" level. The selection transmission circuit 780 may output the read column signal RD_YI as the column signal YI when the control signal CON has a logic "low" level. The selection transmission circuit 780 may output either the write selection signal WT_SEL or the read selection signal RD_SEL as the selection signal SEL in response to the control signal CON. The selection transmission circuit 780 may output the write selection signal WT_SEL as the selection signal SEL when the control signal CON has a logic "high" level. The selection transmission circuit 780 may output the read selection signal RD_SEL as the selection signal SEL when the control signal CON has a logic "low" level.

The reset signal generation circuit 790 may generate the reset signal RST which is enabled in response to the write reset signal WT_RST or the read reset signal RD_RST. The reset signal generation circuit 790 may generate the reset signal RST enabled to have a logic "high" level when either of the write reset signal WT_RST or the read reset signal RD_RST has a logic "high" level.

Figure 17:
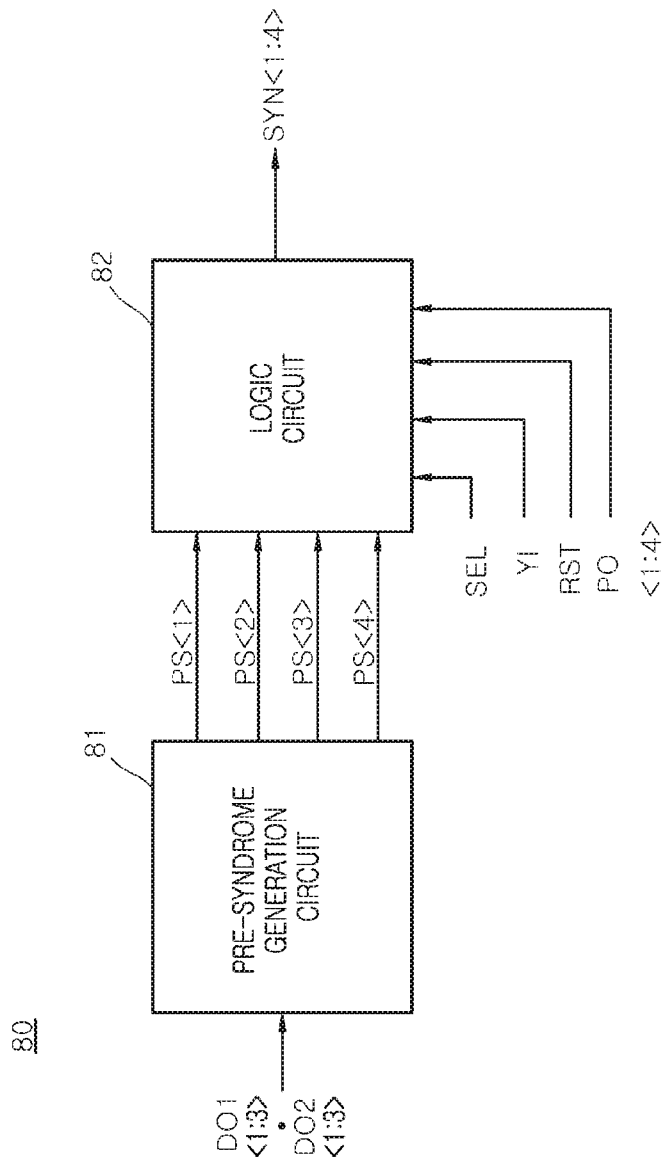
FIG. 17 is a block diagram illustrating a configuration of a syndrome generation circuit included in the semiconductor device of FIG. 12.

Referring to FIG. 17, the syndrome generation circuit 80 may include a pre-syndrome generation circuit 81 and a logic circuit 82

The pre-syndrome generation circuit 81 may perform a logical operation on data bits included in the first output data DO1<1:3> generated during the first read operation to generate first to fourth pre-syndromes PS<1:4>. The pre-syndrome generation circuit 81 may perform a logical operation on data bits in the second output data DO2<1:3>, generated during the second read operation, to generate the first to fourth pre-syndromes PS<1:4>. The first to fourth pre-syndromes PS<1:4> generated during the first read operation may be determined as a first pre-syndrome group. The first to fourth pre-syndromes PS<1:4> generated during the second read operation may be determined as a second pre-syndrome group. The first to fourth pre-syndromes PS<1:4> may be considered a column vector of a matrix. The pre-syndrome generation circuit 81 may provide the matrix to generate syndromes used in an exemplary semiconductor device. Since the matrix used in this embodiment is identical to the matrix illustrated in FIG. 9, a detailed description of the matrix used in this embodiment will be omitted hereinafter.

The logic circuit 82 may store the first to fourth pre-syndromes PS<1:4>, generated during the first read operation, as the first to fourth syndromes SYN<1:4> in response to the selection signal SEL. The logic circuit 82 may store the first to fourth pre-syndromes PS<1:4>, generated during the first read operation, as the first to fourth syndromes SYN<1:4> when the selection signal SEL has a logic "low" level. The logic circuit 82 may change an array sequence of the first to fourth pre-syndromes PS<1:4> generated during the second read operation in response to the selection signal SEL. When the selection signal SEL has a logic "high" level, the logic circuit 82 may change an array sequence of the first to fourth pre-syndromes PS<1:4> generated during the second read operation. To generate the first to fourth syndromes SYN<1:4>, the logic circuit 82 may perform a logical operation on the parity PI<1:4> (including first to fourth parities PI<1:4>) generated during the first read operation and the output parity PO<1:4> (including first to fourth output parities PO<1:4>) generated during the second read operation. The logic circuit 82 may generate the first to fourth syndromes SYN<1:4> initialized in response to the reset signal RST.

Figure 18:
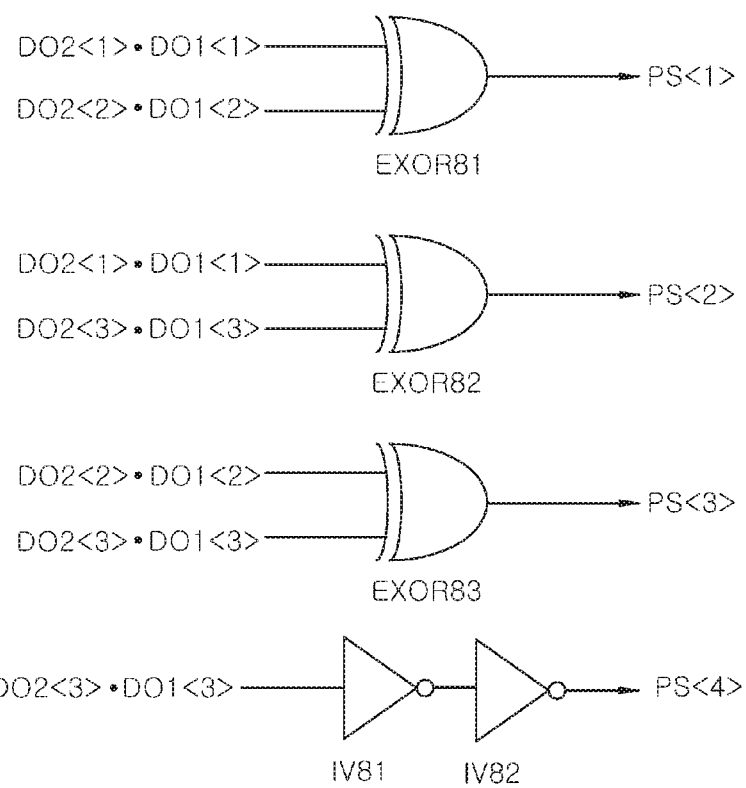
FIG. 18 is a circuit diagram illustrating a configuration of a pre-syndrome generation circuit included in the syndrome generation circuit of FIG. 17.

A configuration and an operation of the pre-syndrome generation circuit 81 will be described hereinafter with reference to FIG. 18.

The pre-syndrome generation circuit 81 may be implemented in a formation of plural exclusive OR gates EXOR81, EXOR82, EXOR83 as well as plural inverters IV81, IV82.

The first to fourth pre-syndromes PS<1:4> may be generated during the first read operation as follows.

The pre-syndrome generation circuit 81 may perform a logical exclusive OR operation on the first bit datum DO1<1> and the second bit datum DO1<2> in the first output data DO1<1:3> through the exclusive OR gate EXOR81 to generate the first pre-syndrome PS<1>.

The pre-syndrome generation circuit 81 may perform a logical exclusive OR operation on the first bit datum DO1<1> and the third bit datum DO1<3> in the first output data DO1<1:3> through the exclusive OR gate EXOR82 to generate the second pre-syndrome PS<2>.

The pre-syndrome generation circuit 81 may generate the third pre-syndrome PS<3> by performing a logical exclusive OR operation on the second bit datum DO1<2> and the third bit datum DO1<3> in the first output data DO1<1:3> through the exclusive OR gate EXOR83.

The pre-syndrome generation circuit 81 may generate the fourth pre-syndrome PS<4> by buffering the third bit datum DO1<3> included in the first output data DO1<1:3> using the inverters IV81, IV82.

The first to fourth pre-syndromes PS<1:4> may be generated during the second read operation as follows.

The pre-syndrome generation circuit 81 may generate the first pre-syndrome PS<1> by performing a logical exclusive OR operation on the first bit datum DO2<1> and the second bit datum DO2<2> in the second output data DO2<1:3> through the exclusive OR gate EXOR81.

The pre-syndrome generation circuit 81 may generate the second pre-syndrome PS<2> by performing a logical exclusive OR operation on the first bit datum DO2<1> and the third bit datum DO2<3> in the second output data DO2<1:3> through the exclusive OR gate EXOR82.

The pre-syndrome generation circuit 81 may perform a logical exclusive OR operation on the second bit datum DO2<2> and the third bit datum DO2<3> in the second output data DO2<1:3> using the exclusive OR gate EXOR83 to generate the third pre-syndrome PS<3>.

The pre-syndrome generation circuit 81 may generate the fourth pre-syndrome PS<4> by buffering the third bit datum DO2<3> included in the second output data DO2<1:3> using the inverters IV81, IV82.

Figure 19:
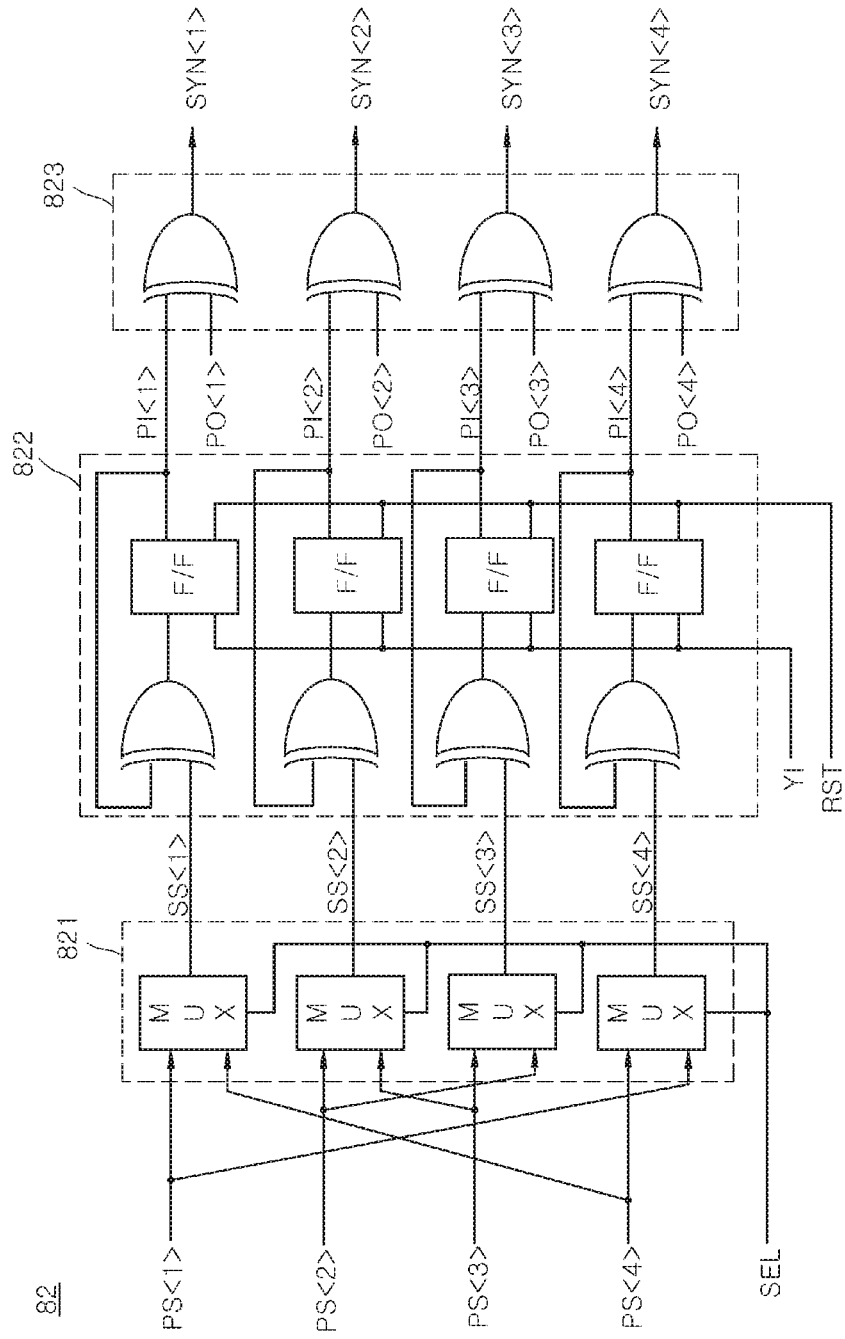
FIG. 19 is a circuit diagram illustrating a configuration of a logic circuit included in the syndrome generation circuit of FIG. 17.

A configuration and an operation of the logic circuit 82 will be described hereinafter with reference to FIG. 19.

The logic circuit 82 may include a selection syndrome generation circuit 821, a parity storage circuit 822 and a syndrome output circuit 823.

The selection syndrome generation circuit 821 may either output the first to fourth pre-syndromes PS<1:4> as first to fourth selection syndromes SS<1:4> respectively, or change an array sequence of the first to fourth pre-syndromes PS<1:4> to output the first to fourth pre-syndromes PS<1:4> rearranged by the changed array sequence as the first to fourth selection syndromes SS<1:4> respectively, in response to the selection signal SEL.

More specifically, when the selection signal SEL is generated to have a logic "low" level, the selection syndrome generation circuit 821 may output the first pre-syndrome PS<1> as the first selection syndrome SS<1>, output the second pre-syndrome PS<2> as the second selection syndrome SS<2>, output the third pre-syndrome PS<3> as the third selection syndrome SS<3>, and output the fourth pre-syndrome PS<4> as the fourth selection syndrome SS<4>. In addition, when the selection signal SEL is generated to have a logic "high" level, the selection syndrome generation circuit 821 may output the first pre-syndrome PS<1> as the fourth selection syndrome SS<4>, output the second pre-syndrome PS<2> as the third selection syndrome SS<3>, output the third pre-syndrome PS<3> as the second selection syndrome SS<2>, and output the fourth pre-syndrome PS<4> as the first selection syndrome SS<1>.

The parity storage circuit 822 may generate the first to fourth parities PI<1:4> initialized in response to the reset signal RST. The parity storage circuit 822 may generate the first to fourth parities PI<1:4> initialized to have a logic "low" level when the reset signal RST has a logic "high" level. The parity storage circuit 822 may store the first to fourth selection syndromes SS<1:4> generated during the first read operation as the first to fourth parities PI<1:4>, in response to the column signal YI. The parity storage circuit 822 may generate the first to fourth parities PI<1:4> by performing a logical operation on the first to fourth parities PI<1:4>, stored during the first read operation in response to the column signal YI, and the first to fourth selection syndromes SS<1:4> generated during the second read operation.

More specifically, when the column signal YI has a logic "high" level during the first read operation, the parity storage circuit 822 may assign the first selection syndrome SS<1> as the first parity PI<1>, assign the second selection syndrome SS<2> as the second parity PI<2>, assign the third selection syndrome SS<3> as the third parity PI<3>, and assign the fourth selection syndrome SS<4> as the fourth parity PI<4>.

When the column signal YI is generated to have a logic "high" level during the second read operation, the parity storage circuit 822 may generate the first parity PI<1> by performing a logical exclusive OR operation of the first parity PI<1> stored during the first read operation and the first selection syndrome SS<1>, may generate the second parity PI<2> by performing a logical exclusive OR operation of the second parity PI<2> stored during the first read operation and the second selection syndrome SS<2>, may generate the third parity PI<3> by performing a logical exclusive OR operation of the third parity PI<3> stored during the first read operation and the third selection syndrome SS<3>, and may generate the fourth parity PI<4> by performing a logical exclusive OR operation on the fourth parity PI<4>, stored during the first read operation, and the fourth selection syndrome SS<4>.

The syndrome output circuit 823 may perform a logical exclusive OR operation on the first parity PI<1> and the first output parity PO<1> to generate the first syndrome SYN<1>. The syndrome output circuit 823 may generate the second syndrome SYN<2> by performing a logical exclusive OR operation on the second parity PI<2> and the second output parity PO<2>. The syndrome output circuit 823 may perform a logical exclusive OR operation on the third parity PI<3> and the third output parity PO<3> to generate the third syndrome SYN<3>. Further, the syndrome output circuit 823 may generate the fourth syndrome SYN<4> by performing a logical exclusive OR operation on the fourth parity PI<4> and the fourth output parity PO<4>.

As described above, a semiconductor device according to another embodiment may adjust two half matrices generating syndromes for correcting data errors during two read operations so that column vectors of a first half matrix of the two half matrices are symmetrical with column vectors of a second half matrix of the two half matrices. As a result, an area allocated for a circuit establishing the matrices may be reduced.

Figure 20:
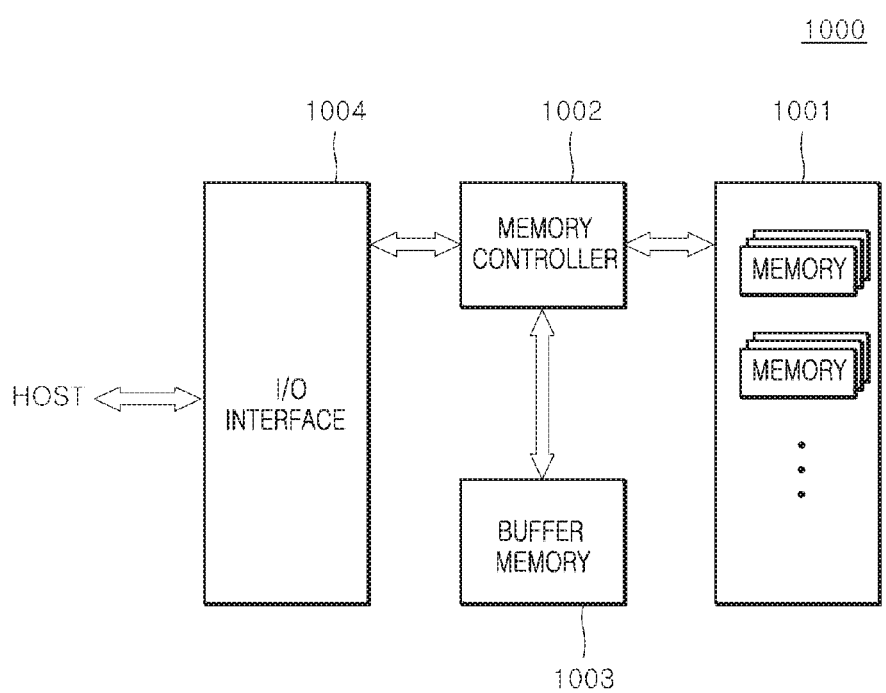
FIG. 20 is a block diagram illustrating a configuration of an electronic system employing at least one of the semiconductor devices described with reference to FIGS. 1 to 19.

At least one of the semiconductor devices described with reference to FIGS. 1 to 19 may be applied to an electronic device that includes a memory system, a graphic system, a computing system, a mobile system, or the like. By the way of example but not limitation, as illustrated in FIG. 20, an electronic system 1000 may include a data storage circuit 1001, a memory controller 1002, a buffer memory 1003, and an input/output (I/O) Interface 1004.

The data storage circuit 1001 may store data delivered from the memory controller 1002, or read and provide the stored data to the memory controller 1002, responsive to a control signal outputted from the memory controller 1002. The data storage circuit 1001 may include at least one of the semiconductor devices illustrated in FIGS. 1 and 12. Meanwhile, the data storage circuit 1001 may include a nonvolatile memory that can retain their stored data even when its power supply is interrupted or a power is not supplied. The nonvolatile memory may be a flash memory such as a NOR-type flash memory or a NAND-type flash memory, a phase change random access memory (PRAM), a resistive random-access memory (RRAM), a spin transfer torque random access memory (STTRAM), a magnetic random-access memory (MRAM), or the like.

The memory controller 1002 may receive a command delivered from an external device (e.g., a host) through the I/O interface 1004 and decode the command, outputted from the host, to control an operation for either inputting data into the data storage circuit 1001 or the buffer memory 1003, or outputting the data stored in the data storage circuit 1001 or the buffer memory 1003. Although FIG. 20 illustrates the memory controller 1002 with a single unit or module, the memory controller 1002 may include plural controllers, e.g., one controller for controlling the data storage circuit 1001 including a nonvolatile memory and another controller for controlling the buffer memory 1003 including a volatile memory.

The buffer memory 1003 may temporarily store the data handled by the memory controller 1002. That is, the buffer memory 1003 may temporarily store the data outputted from, or transmitted into, the data storage circuit 1001. The buffer memory 1003 may store the data, delivered from the memory controller 1002, according to a control signal. The buffer memory 1003 may read and output the stored data to the memory controller 1002. The buffer memory 1003 may include a volatile memory such as a dynamic random-access memory (DRAM), a mobile DRAM, a static random-access memory (SRAM), or the like.

The I/O interface 1004 may physically and electrically connect the memory controller 1002 to the external device (i.e., the host). Thus, the memory controller 1002 may receive control signals and/or data from the external device (i.e., the host) through the I/O interface 1004, and output the data generated by the memory controller 1002 to the external device (i.e., the host) through the I/O interface 1004. That is, the electronic system 1000 may communicate with the host through the I/O interface 1004. The I/O interface 1004 may be designed or utilized for any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid-state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 21:
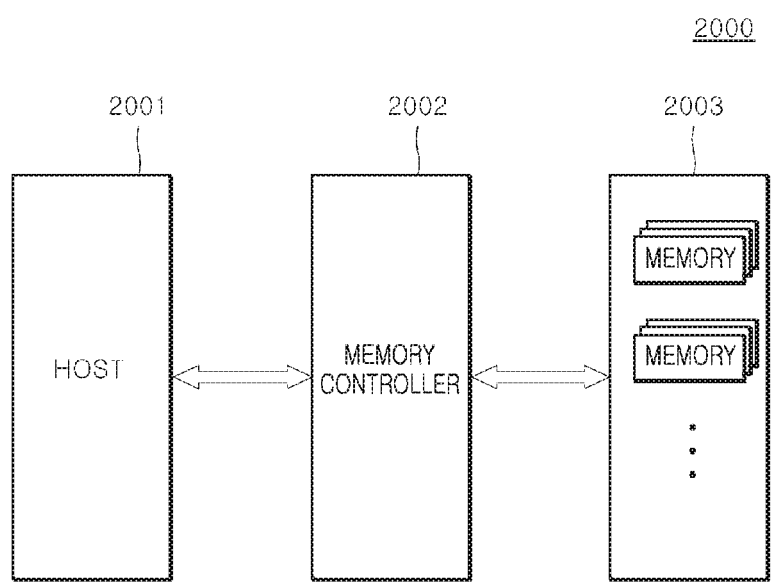
FIG. 21 is a block diagram illustrating a configuration of another electronic system employing at least one of the semiconductor devices described with reference to FIGS. 1 to 19.

Referring to FIG. 21, an electronic system 2000 according another embodiment may include a host 2001, a memory controller 2002 and a data storage circuit 2003.

The host 2001 may output a request signal and data to the memory controller 2002 to access, or jack in, the data storage circuit 2003. The memory controller 2002 may supply the data, a data strobe signal, a command, addresses and a clock signal to the data storage circuit 2003 in response to the request signal, and the data storage circuit 2003 may execute a write operation or a read operation in response to the command. The host 2001 may transmit the data to the memory controller 2002 to write the data in the data storage circuit 2003. In addition, the host 2001 may receive the data from the data storage circuit 2003 through the memory controller 2002. The host 2001 may include a circuit configured to use an error correction code (ECC) scheme to correct errors of the data.

The memory controller 2002 may act as an interface that connects the host 2001 to the data storage circuit 2003 for communication between the host 2001 and the data storage circuit 2003. The memory controller 2002 may receive the request signal and the data from the host 2001, and generate and supply the data, the data strobe signal, the command, the addresses and the clock signal to the data storage circuit 2003 in order to control operations of the data storage circuit 2003. In addition, the memory controller 2002 may supply the data, outputted from the data storage circuit 2003, to the host 2001.

The data storage circuit 2003 may include a plurality of memories. The data storage circuit 2003 may receive the data, the data strobe signal, the command, the addresses and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include at least one of the semiconductor devices illustrated in FIGS. 1 and 12.

In some embodiments, the electronic system 2000 may be implemented to selectively operate one of the ECC circuits included in the host 2001 and the data storage circuit 2003. Alternatively, the electronic system 2000 may be implemented to simultaneously operate all of the ECC circuits included in the host 2001 and the data storage circuit 2003. By the way of example but not limitation, the host 2001 and the memory controller 2002 may be implemented in a single chip. The memory controller 2002 and the data storage circuit 2003 may be implemented in a single chip.

While the disclosure has been described in connection with what is presently considered to be the most practical and preferred example, it is to be understood that the invention is not to be limited to the disclosed examples but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A semiconductor device comprising:
   a read data generation circuit configured to generate first read data from first output data and a first output parity generated during a first read operation, and to generate second read data from second output data and a second output parity generated during a second read operation; and
   a syndrome generation circuit configured to generate a syndrome signal based at least on the first read data and the second read data,
   wherein the first read operation and the second read operation are sequentially performed by a single read signal having a single activation pulse entered to the semiconductor device.

2. The semiconductor device of claim 1, wherein the syndrome generation circuit generates the syndrome signal so that column vectors of a first half matrix corresponding to the first read data are symmetric to column vectors of a second half matrix corresponding to the second read data.

3. The semiconductor device of claim 1,
   wherein the first output data are outputted from a first memory area,
   the second output data are outputted from a second memory area,
   the first output parity is outputted from a third memory area, and
   the second output parity is outputted from a fourth memory area, and
   wherein the first, the second, the third, and the fourth memory areas are separate.

4. The semiconductor device of claim 1, wherein the read data generation circuit includes:
   a control circuit configured to generate a column signal including a first pulse and a second pulse sequentially made in response to a read signal, and to generate a selection signal enabled in response to the read signal and disabled in response to a column delay signal; and
   a data synthesis circuit configured to generate the first read data from the first output data and the first output parity in response to the first pulse of the column signal, and to generate the second read data from the second output data and the second output parity in response to the second pulse of the column signal.

5. The semiconductor device of claim 4, wherein the control circuit includes:
   a selection signal generation circuit configured to generate the selection signal enabled in response to the read signal and disabled in response to the column delay signal;
   a reset signal generation circuit configured to generate a reset signal enabled during a predetermined period in response to the read signal when the selection signal is enabled; and
   a column signal generation circuit configured to generate the column signal including the first pulse and the second pulse sequentially made in response to the read signal.

6. The semiconductor device of claim 1,
   wherein the syndrome signal includes first to fourth syndromes; and
   wherein the syndrome generation circuit includes:
   a pre-syndrome generation circuit configured to perform a logical operation on data bits included in the first read data, generated during the first read operation, to generate first to fourth pre-syndromes, and to perform a logical operation on data bits in the second read data, generated during the second read operation, to generate the first to fourth pre-syndromes; and a logic circuit configured to store the first to fourth pre-syndromes, generated during the first read operation, as the first to fourth syndromes in response to a selection signal, and to generate the first to fourth syndromes by changing an array sequence of the first to fourth pre-syndromes generated during the second read operation in response to a selection signal and by performing a logical operation on the first to fourth pre-syndromes rearranged according to the changed array sequence and the first to fourth syndromes generated during the first read operation.

7. The semiconductor device of claim 6, wherein the first to fourth syndromes are determined by a column vector of the first half matrix or the second half matrix.

8. The semiconductor device of claim 6, wherein the logic circuit generates the first syndrome by performing a logical operation on the first pre-syndrome generated during the first read operation and the fourth pre-syndrome generated during the second read operation, generates the second syndrome by performing a logical operation on the second pre-syndrome generated during the first read operation and the third pre-syndrome generated during the second read operation, generates the third syndrome by performing a logical operation on the third pre-syndrome generated during the first read operation and the second pre-syndrome generated during the second read operation, and generates the fourth syndrome by performing a logical operation on the fourth pre-syndrome generated during the first read operation and the first pre-syndrome generated during the second read operation.

9. The semiconductor device of claim 6, wherein the logic circuit includes:
a selection syndrome generation circuit configured to output the first to fourth pre-syndromes as first to fourth selection syndromes when the selection signal is enabled, and to change an array sequence of the first to fourth pre-syndromes to output the first to fourth pre-syndromes rearranged according to the changed array sequence as the first to fourth selection syndromes when the selection signal is disabled; and
a syndrome storage circuit configured to store the first to fourth selection syndromes, generated during the first read operation, as the first to fourth syndromes in response to a column delay signal, and to generate the first to fourth syndromes by performing a logical operation on the first to fourth selection syndromes, generated during the second read operation, and the first to fourth syndromes stored in response to the column delay signal.

10. The semiconductor device of claim 1,
wherein the syndrome signal includes first to fourth syndromes; and
wherein the syndrome generation circuit includes:
a pre-syndrome generation circuit configured to perform a logical operation on data bits included in the first read data generated during the first read operation to generate first to fourth pre-syndromes, and to perform a logical operation on data bits included in the second read data generated during the second read operation to generate the first to fourth pre-syndromes; and
a logic circuit configured to store the first to fourth pre-syndromes generated during the first read operation as the first to fourth syndromes, and to generate the first to fourth syndromes by performing a logical operation on the first to fourth pre-syndromes generated during the second read operation and the first to fourth syndromes generated during the first read operation.

11. The semiconductor device of claim 10, wherein the logic circuit is configured to generate the first to fourth syndromes by changing an array sequence of the first to fourth syndromes stored during the first read operation and performing a logical operation on the first to fourth syndromes rearranged according to the changed array sequence and the first to fourth pre-syndromes generated during the second read operation.

12. The semiconductor device of claim 1, further comprising:
a parity generation circuit configured to generate a parity including error information regarding an input data during a write operation; and
a memory area configured to store the input data and the parity during the write operation.

13. The semiconductor device of claim 12,
wherein the memory area is configured to output a portion of the stored input data as the first output data, and to output a portion of the stored parity as the first output parity, during the first read operation; and
wherein the memory area is configured to output the remaining portion of the stored input data as the second output data, and to output the remaining portion of the stored parity as the second output parity, during the second read operation.

14. The semiconductor device of claim 1, further comprising a data correction circuit configured to correct errors of the first and second output data using the syndrome signal during the second read operation, and to synthesize the first and second output data, which are corrected, to output the synthesized data as corrected data.

15. A method of correcting data errors of a semiconductor device, the method comprising:
a first step of generating first read data from first output data and a first output parity provided during a first read operation;
a second step of generating a first pre-syndrome group including error information on the first read data to store the first pre-syndrome group; and
a third step of generating second read data from second output data and a second output parity provided during a second read operation, generating a second pre-syndrome group including error information on the second read data, and generating a syndrome signal by performing a logical operation on the first pre-syndrome group and the second pre-syndrome group,
wherein the first read operation and the second read operation are sequentially performed by a single read signal having a single activation pulse inputted to the semiconductor device.

16. The method of claim 15,
wherein the first pre-syndrome group and the second pre-syndrome group are generated to be symmetric.

17. The method of claim 15,
wherein the first output data are outputted from a first memory area,
the second output data are outputted from a second memory area,
the first output parity is outputted from a third memory area, and
the second output parity is outputted from a fourth memory area, and
wherein the first, the second, the third, and the fourth memory areas are separate.

18. The method of claim 15,
wherein the first pre-syndrome group includes first to fourth pre-syndromes generated during the first read operation, the second pre-syndrome group includes the first to fourth pre-syndromes generated during the second read operation, and the syndrome signal includes first to fourth syndromes; and wherein the third step includes:

a step of generating the first syndrome by performing a logical operation on the first pre-syndrome, generated from the first read data during the first read operation, and the fourth pre-syndrome generated from the second read data during the second read operation;

a step of generating the second syndrome by performing a logical operation on the second pre-syndrome, generated from the first read data during the first read operation, and the third pre-syndrome generated from the second read data during the second read operation;

a step of generating the third syndrome by performing a logical operation on the third pre-syndrome, generated from the first read data during the first read operation, and the second pre-syndrome generated from the second read data during the second read operation; and a step of generating the fourth syndrome by performing a logical operation on the fourth pre-syndrome, generated from the first read data during the first read operation, and the first pre-syndrome generated from the second read data during the second read operation.

19. The method of claim 18, wherein the first to fourth syndromes are set by column vectors of a matrix for performing a logical operation on data bits included in the first and second read data.

20. The method of claim 15, further comprising:

a step of generating a parity including error information on input data during a write operation to store the input data and the parity; and a step of correcting errors of output data generated from the input data using the syndrome signal to output the corrected output data as corrected data.

21. The method of claim 20, wherein a portion of the input data stored during the write operation is outputted as the first output data and a portion of the parity stored during the write operation is outputted as the first output parity, while the first read operation is performed; and wherein the remaining portion of the input data stored during the write operation is outputted as the second output data and the remaining portion of the parity stored during the write operation is outputted as the second output parity, while the second read operation is performed.

22. A semiconductor device comprising:

a memory area configured to store input data and a parity during a write operation, configured to output first input data of the input data as first output data and to output the parity as an output parity during a first read operation, and configured to output second input data of the input data as second output data and to output the parity as the output parity during a second read operation; and a syndrome generation circuit configured to generate the parity from the input data during the write operation, configured to generate the parity by performing a logical operation on the first output data and the output parity during the first read operation, and configured to generate a syndrome signal by performing a logical operation on the parity generated during the first read operation, the second output data, and the output parity during the second read operation, wherein the syndrome generation circuit generates the syndrome signal so that column vectors of a first half matrix corresponding to the first output data are symmetric to column vectors of a second half matrix corresponding to the second output data, wherein the first read operation and the second read operation are sequentially performed by a single read signal having a single activation pulse entered to the semiconductor device.

23. The semiconductor device of claim 22, wherein the parity is a signal including error information on the input data.

24. The semiconductor device of claim 22, wherein the first output data and the second output data are outputted from a first memory area and a second memory area, respectively.

25. The semiconductor device of claim 22, wherein the memory area is configured to store a portion of the input data as the first input data, to store the remaining portion of the input data as the second input data, and to store the parity, while the write operation is performed;

wherein the memory area is configured to output the stored first input data as the first output data and to output the stored parity as the output parity, while the first read operation is performed; and wherein the memory area is configured to output the stored second input data as the second output data and to output the stored parity as the output parity, while the second read operation is performed.

26. The semiconductor device of claim 22, further comprising:

a column signal generation circuit configured to generate a column signal including a first pulse and a second pulse which are sequentially made in response to a write signal or a read signal and configured to generate a selection signal and a reset signal which are enabled in response to the write signal or the read signal; and a data correction circuit configured to correct errors of the first and second output data using the syndrome signal during the second read operation and configured to synthesize the first and second output data, which are corrected, to output the synthesized data as corrected data.

27. The semiconductor device of claim 26, wherein the column signal generation circuit includes:

a write pulse generation circuit configured to generate a write column signal including a first pulse and a second pulse which are sequentially made in response to the write signal and configured to generate a write selection signal and a write reset signal which are enabled in response to the write signal;

a read pulse generation circuit configured to generate a read column signal including a first pulse and a second pulse which are sequentially made in response to the read signal and configured to generate a read selection signal and a read reset signal which are enabled in response to the read signal; and a control circuit configured to output one of the write column signal and the read column signal as the column signal and to output one of the write selection signal and the read selection signal as the selection signal in response to the write signal and the read signal and configured to generate the reset signal which is enabled in response to the write reset signal or the read reset signal.

28. The semiconductor device of claim 22, wherein the syndrome signal includes first to fourth syndromes;

wherein the output parity includes first to fourth output parities; and wherein the syndrome generation circuit includes:

a pre-syndrome generation circuit configured to perform a logical operation on data bits included in the first output data generated during the first read operation to generate first to fourth pre-syndromes and configured to perform a logical operation on data bits included in the second output data generated during the second read operation to generate the first to fourth pre-syndromes; and a logic circuit configured to store the first to fourth pre-syndromes generated during the first read operation as first to fourth parities included in the parity in response to a selection signal, configured to change an array sequence of the first to fourth pre-syndromes, generated during the second read operation, to store the first to fourth pre-syndromes rearranged by the changed array sequence as the first to fourth parities, and configured to generate the first to fourth syndromes by performing a logical operation on the first to fourth parities and the first to fourth output parities.

29. The semiconductor device of claim 28, wherein the first to fourth syndromes are set by a column vector of the first half matrix or the second half matrix.

30. The semiconductor device of claim 28, wherein the logic circuit includes:

a selection syndrome generation circuit configured to output the first to fourth pre-syndromes as first to fourth selection syndromes when the selection signal is enabled, and to change an array sequence of the first to fourth pre-syndromes to output the first to fourth pre-syndromes rearranged according to the changed array sequence as the first to fourth selection syndromes when the selection signal is disabled;

a parity storage circuit configured to store the first to fourth selection syndromes, generated during the first read operation, as the first to fourth parities in response to a column signal and configured to perform a logical operation on the first to fourth selection syndromes generated during the second read operation and the first to fourth parities stored in response to the column signal to generate and store the first to fourth parities; and a syndrome output circuit configured to perform a logical operation on the first to fourth parities stored in the parity storage circuit and the first to fourth output parities to generate the first to fourth syndromes.

* * * * *